US006384694B1

(12) United States Patent
Tanizaki et al.

(10) Patent No.: US 6,384,694 B1
(45) Date of Patent: May 7, 2002

(54) DIELECTRIC LINE CONVERTER, DIELECTRIC LINE UNIT, DIRECTIONAL COUPLER, HIGH-FREQUENCY CIRCUIT MOBILE, AND TRANSMITTER-RECEIVER

(75) Inventors: Toru Tanizaki, Nagoakakyo; Ikuo Takakuwa, Suita; Atsushi Saitoh, Muko, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/425,841

(22) Filed: Oct. 21, 1999

(30) Foreign Application Priority Data

Oct. 22, 1998 (JP) .......................................... 10-300754

(51) Int. Cl.[7] ............................ H01P 1/16; H01P 1/00; H03H 7/38

(52) U.S. Cl. ....................... 333/21 R; 333/248; 333/33; 333/34

(58) Field of Search .............................. 333/21 R, 113, 333/109, 248, 33, 34

(56) References Cited

U.S. PATENT DOCUMENTS 6,172,648 B1 * 1/2001 Tanizaki et al. ............ 343/753

FOREIGN PATENT DOCUMENTS

| | | |
|---|---|---|
| JP | 7283634 | 10/1995 |
| JP | 770209 | 3/1996 |
| JP | 10065413 | 3/1998 |

OTHER PUBLICATIONS

Malherbe J. A. G. et al: "A Transition From Rectangular to Nonradiating Dielectric Waveguide" Transactions of the Ire Professional Group on Microwave Theory and Techniques, IEEE Inc. New York, US, vol. MTT–33, No. 6, Jun. 1985, pp. 539–543.

Ishikawa Y. et al: "Complex Permittivity Measurement of Dielectric Materials Using Nonradiative Dielectric Guide at Millimeter Wavelength" Electronics & Communications in Japan, Part II—Electronics, US, Scripta Technica. New York vol. 79, No. 2, Feb. 1, 1996, pp. 55–69.

"A Design of Waveguide—Type Directional Couplers Based on E–Plane Planar Circuit Approach", T. Kawai et al., IEICE Technical Report MW 96–22 (May 1996).

* cited by examiner

*Primary Examiner*—Robert Pascal
*Assistant Examiner*—Kimberly E. Glenn
(74) *Attorney, Agent, or Firm*—Ostrolenk, Faber, Gerb & Soffen

(57) ABSTRACT

A dielectric line converter which includes a dielectric stripline; an upper conductor surface and a lower conductor surface sandwiching the dielectric stripline; the upper and lower conductor surfaces having a first spacing in a first region along the dielectric stripline so as to form a first-kind dielectric line, a second spacing which is substantially zero in a second region so as to form a second-kind dielectric line, and a third spacing which is less than the first spacing in a line conversion region between the first and second regions. Grooves may be formed in the opposing surfaces of the upper and lower conductor surfaces, and the dielectric stripline may be arranged in the grooves. Impedance matching between the first-kind and second-kind dielectric lines is arranged n the line conversion region. The length of the line conversion portion may be set to be an odd multiple of $\lambda/4$.

16 Claims, 20 Drawing Sheets

HNRD(FIRST-KIND LINE)

TR(LINE CONVERSION PORTION)

DWG(SECOND-KIND LINE)

HNRD FIRST-KIND LINE

TR LINE CONVERSION PORTION

DWG SECOND-KIND LINE

DIELECTRIC LINE CONVERTER, DIELECTRIC LINE UNIT, DIRECTIONAL COUPLER, HIGH-FREQUENCY CIRCUIT MOBILE, AND TRANSMITTER-RECEIVER

BACKGROUND OF THE INVENTION

1. Field of the Invention

The present invention relates to a line converter for coupling between dielectric lines of different kinds, and a directional coupler, dielectric line unit, high-frequency circuit module, and transmitter-receiver which use the line converter.

2. Description of the Related Art

In the high-frequency field, two types of directional couplers have been used. One type utilizes dielectric wave guides ("DWG"). Couplers using DWG are operable for use in broadband applications. On the other hand, DWG-type couplers are not advantageous from the standpoint of miniaturization.

A DWG directional coupler is shown in Kawai et al., "A Design of Waveguide-Type Directional Couplers Based on E-Plane Planar Circuit Approach," IEICE Technical Report MW 96-22 (May 1996). The coupler is formed by dielectric waveguides (DWG) which are formed by filling dielectric material in a waveguide.

The other type of directional coupler utilizes the nonradiative dielectric ("NRD") waveguide. The NRD waveguide has a disadvantage, in that the characteristic values such as power distribution ratio, and so on, can be kept within fixed limits only within a narrow bandwidth.

An example of an NRD directional coupler is disclosed in FIG. 2 of Japanese Laid-Open No. H07-283634 (equivalent to U.S. Ser. No. 08/837,836). A directional coupler 25 consists of two opposing dielectric strips 30a, 30b which are disposed on a conductor plate 5. The strips 30a, 30b are overlaid by an opposing conductor plate, not shown.

It has been proposed to combine the DWG and NRD waveguides in order to enjoy the advantages of both.

One example of such a hybrid is shown in FIG. 13 of Japanese Laid-Open No. H08-70209 (Application No. H06205426 filed Aug. 30, 1994), which corresponds to U.S. Pat. No. 5,600,289. In FIG. 13, β indicates a section formed by a DWG, while γ indicates a section formed by an NRD guide. As understood from the drawing, the tapered structures are provided in order to realize a conversion from one type of line to the other.

When implementing such a hybrid structure in a directional coupler, several tapered portions may be necessary because the two opposing lines each require respective line conversions. For example, ports 1–4 of the DWG directional coupler in Kawai et al. may be connected to respective NRD guides by respective line converters. This significantly increases the size of the directional coupler.

The above-described types of line converter for coupling between the DWG and the NRD guide have the advantage of low line conversion loss over a broad band. However, the line converter becomes large-sized as a whole because of the required length of the line conversion portion.

For example, NRD guides can be used as input-output portions in a DWG-type parallel-line directional coupler in which two dielectric striplines are arranged in parallel between two upper and lower conductor surfaces. By use of the DWG waveguide type, broad-band characteristics can be obtained. However, a line converter is required between the DWG and the NRD guide. As a result, the whole system becomes large-sized.

SUMMARY OF THE INVENTION

In response to the foregoing problems of the prior art, the present invention is able to provide a small line-conversion structure between a DWG and an NRD guide.

A dielectric line converter according to the present invention has a good line conversion characteristic and is small in size.

Further, a directional coupler according to the present invention has wide-band characteristics and is made up of small-sized dielectric lines.

Further, a high-frequency circuit module and/or a transmitter-receiver according to the invention can include a dielectric line unit or a directional coupler comprising the above dielectric line converter.

According to an aspect of the present invention, a line converter comprises a first-kind dielectric line having upper and lower conductor surfaces contacting the top and bottom of a dielectric stripline and spaces beside the dielectric stripline, between the dielectric stripline and side conductive surfaces spaced away from said dielectric stripline, a second-kind dielectric line having upper, lower and side conductor surfaces substantially contacting the top, bottom and sides of a dielectric stripline, and an intermediate dielectric stripline connected between the dielectric striplines of the first-kind and second-kind dielectric lines (advantageously being continuous with the dielectric striplines of the first-kind and second-kind dielectric lines), wherein the space between the upper and lower conductor surfaces in the region of the intermediate dielectric stripline is made narrower than the space between the upper and lower conductor surfaces in the first-kind line, and wherein the space between the upper and lower conductor surfaces in the second-kind dielectric line is substantially zero.

Because of this construction, as the space between the upper and lower conductor surfaces in the region of the intermediate dielectric stripline does not change abruptly between the first-kind dielectric line to the second-kind dielectric line (which may preferably be dielectric-loaded waveguide), a line conversion takes place without deteriorating reflection characteristics, and as the line does not need to be widened, it becomes easy to make the line converter small.

In the above construction, when the space between the upper and lower conductor surfaces in the region of the intermediate dielectric line narrows gradually from the first-kind dielectric line to the second-kind dielectric line, the reflection at the discontinuity portion is further suppressed.

Further, when the length of the intermediate dielectric line between the first-kind dielectric line and the second-kind dielectric line is made an odd multiple of a quarter-wavelength of the signal on the line, the waves reflected at the two locations where in which the space changes, between the upper and lower conductor surfaces in the region of the intermediate dielectric stripline, i.e., at the respective junctions with the first-kind and second-kind dielectric lines, are superposed in opposite phase, and consequently the reflected waves are canceled. Accordingly, the reflection characteristic is improved.

Further, according to another aspect of the present invention, a line converter comprises a first-kind dielectric line having upper and lower conductor surfaces contacting the top and bottom of a dielectric stripline and spaces beside the dielectric stripline, between the dielectric stripline and side conductive surfaces spaced away from said dielectric stripline, a second-kind dielectric line having upper, lower and side conductor surfaces substantially contacting the top, bottom and sides of a dielectric stripline, and an intermediate dielectric stripline connected between the dielectric striplines of the first-kind and second-kind dielectric lines (advantageously being continuous with the dielectric striplines of the first-kind and second-kind dielectric lines), wherein the space from the intermediate dielectric stripline to the side conductor surface is made a constant value which is narrower than the space from the dielectric stripline of the first-kind dielectric line to the side conductor surface of the first-kind dielectric line.

Because of this construction, as the space between the side conductor surfaces and the intermediate dielectric stripline changes in a stepped way from the first-kind dielectric line to the second-kind dielectric line (which preferably may be a dielectric-loaded waveguide), the line converter does not have to be long. As the result, a short line converter can be obtained.

In the above construction, when the length between the first-kind dielectric line and the second-kind dielectric line is made an odd multiple of a fourth of a wavelength of the signal on the line, the waves reflected at the two locations where the space between the side conductor surfaces spaced away from the intermediate dielectric stripline changes, i.e., at the respective junctions with the first-kind and second-kind dielectric lines, are superposed in opposite phase, and consequently the reflected waves are canceled. Accordingly, the reflection characteristic is improved.

The first-kind dielectric line in any of the above aspects of the invention advantageously can be a hyper-NRG guide, which propagates only the LSM mode, by making the space between the upper and lower conductor surfaces of the first-kind dielectric line narrower than the height of the dielectric stripline of the first-kind dielectric line. Thus, a dielectric line circuit having a dielectric line and dielectric-loaded waveguide in which there is hardly any mode conversion loss at a bend in the dielectric line can be easily constructed.

According to another aspect of the present invention, one of the above dielectric line converters can be modified to provide a dielectric line unit. For example, a circuit board and a microstripline on the circuit board can be disposed within a second-kind dielectric line, and one of the above dielectric line converters can be connected to said second-type dielectric line. Thus, a dielectric line unit including the second-kind dielectric line can be constructed so that a first-kind dielectric line can be directly connected to the dielectric line unit.

According to a further aspect of the present invention, the above dielectric line converters can be employed in a directional coupler. For example, two second-kind dielectric lines of two respective line converters can be joined together or integrated at a coupling region to constitute a directional coupler. In this way, a directional coupler into which signals can be input through an NRD guide and which has a broad-band characteristic can be obtained.

Further, according to other aspects of the present invention, the above dielectric line units or directional couplers can be used to propagate a transmission signal or a reception signal in a high-frequency circuit module.

Furthermore, also according to aspects of the present invention, a transceiver can be provided by one of the above high-frequency circuit modules, together with a transmission circuit and a reception circuit.

Other features and advantages of the invention will be understood from the following detailed description, together with the drawings, in which like references denote like elements and parts.

DESCRIPTION OF EMBODIMENTS OF THE INVENTION

Figure 1A:
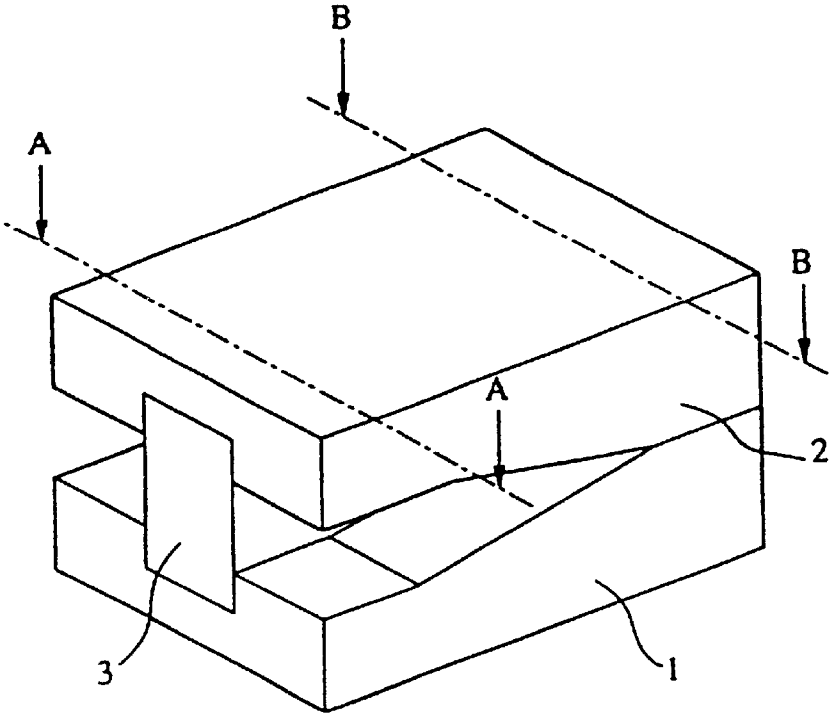
FIGS. 1A and 1B are perspective views showing the construction of a dielectric line converter according to a first embodiment.
Figure 1B:
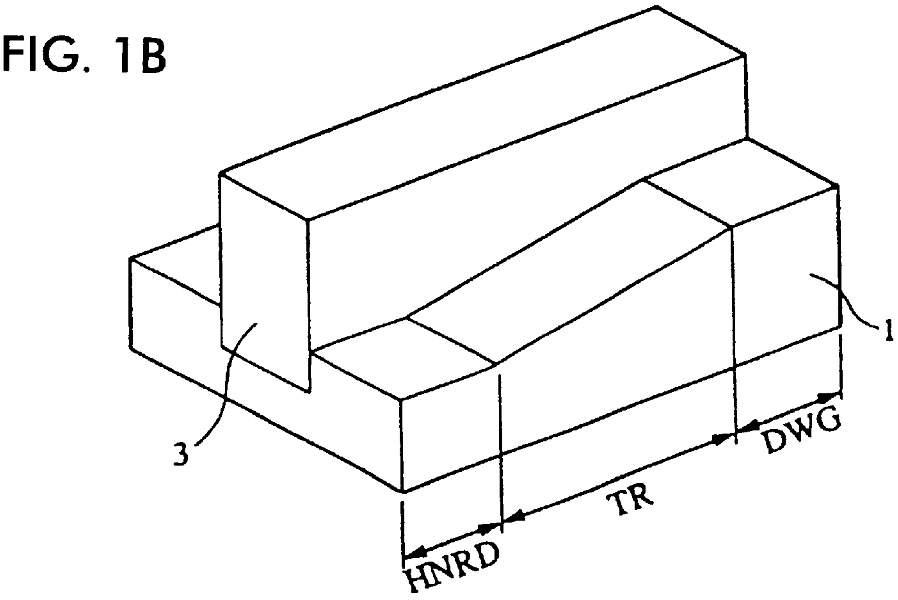
Figure 2A:
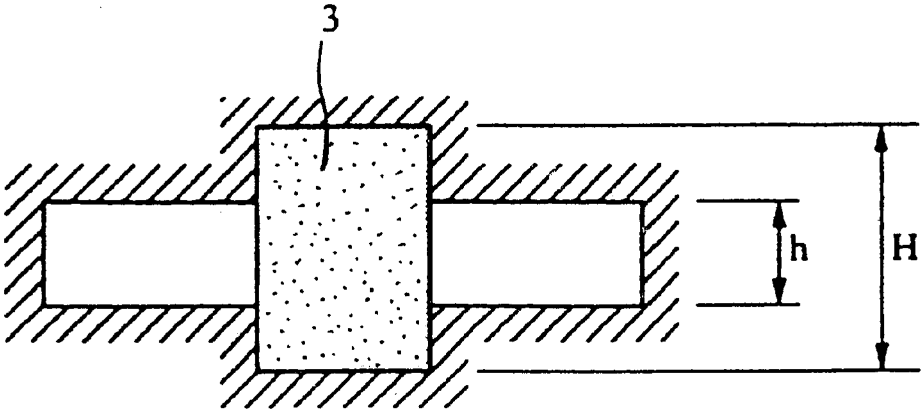
FIGS. 2A and 2B respectively show sectional views taken along lines A—A and B—B in FIG. 1A.
Figure 2B:
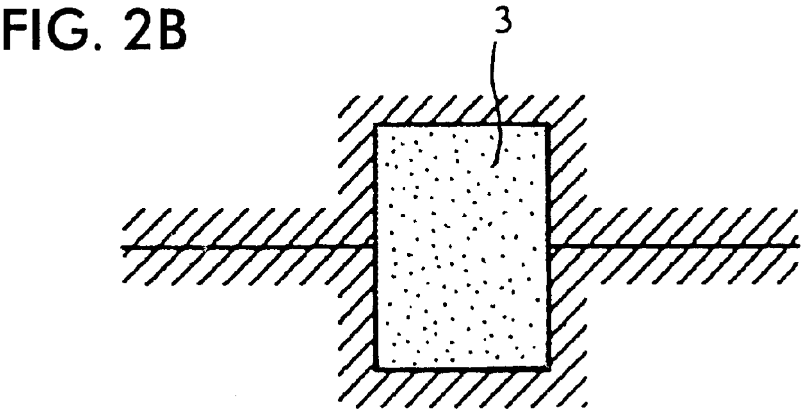

The construction of a dielectric line converter according to a first embodiment of the present invention is shown in FIGS. 1A–2B. FIG. 1A is a perspective view of the whole converter, with the side conductor surfaces omitted, and FIG. 1B is a perspective view corresponding to FIG. 1A in which the upper conductor plate is removed. FIG. 2A is a sectional view taken on line A—A of FIG. 1A, including the side conductor surfaces, and FIG. 2B is a sectional view taken on line B—B.

In FIGS. 1A–1B, reference numerals 1 and 2 each represent a respective conductor plate which is composed of an electrode film formed on the surface of a molded insulating plate or a conductor plate which is composed of a processed metal plate. Reference numeral 3 represents a dielectric stripline produced by injection molding or cutting work, which is made of synthetic resin, ceramics, or their composite materials. PTFE of dielectric constant $\epsilon r=2.04$ can be used as the dielectric stripline in all of the examples herein. As shown in FIG. 1B, by arranging the dielectric stripline 3 between the upper and lower conductor plates 1 and 2, a first-kind dielectric line HNRD, a second-kind dielectric line DWG, and a line conversion portion TR therebetween are constructed.

The dimensions of the dielectric stripline 3 in the height and width directions are constant in the first-kind dielectric line, second-kind dielectric line, and the line conversion portion. As shown in FIG. 2A, in the first-kind dielectric line portion, the space h between the opposing surfaces (conductor surfaces) of the upper and lower conductor plates is made smaller than the height dimension H of the dielectric stripline 3. In this way, a hyper-NRD guide (indicated by HNRD in FIG. 1B) propagating a single LSM01 mode is constructed. As shown in FIG. 2B, in the second-kind dielectric line portion, the upper and lower conductor plates 1 and 2 are put one on another, that is, the space between the opposing surfaces is made nearly zero. Accordingly, the groove depth in the conductor plates of the second-kind dielectric line portion is set to be half of the height dimension of the dielectric stripline 3. In this way, the second-kind dielectric line is made a dielectric-loaded waveguide (indicated by DWG in FIG. 1B).

In the line conversion portion (indicated by TR in the figure), the groove depth is gradually changed so that the space between the opposing surfaces of the upper and lower conductor plates 1 and 2 becomes tapered from the first-kind dielectric line portion to the second-kind dielectric line portion. Because of this construction, signal reflection is reduced at and between the input-output portions (see for example the input-output portions 31, 32, 33, 34 in FIGS. 12–13), so the line converter has a good reflection characteristic.

Figure 3A:
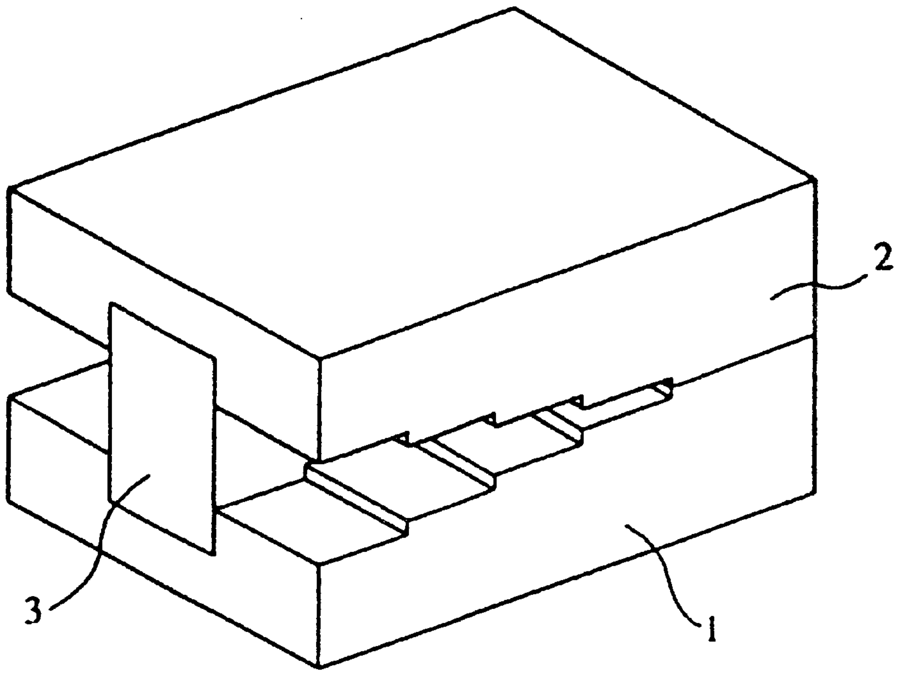
FIGS. 3A and 3B are perspective views showing the construction of a dielectric line converter according to a second embodiment.
Figure 3B:
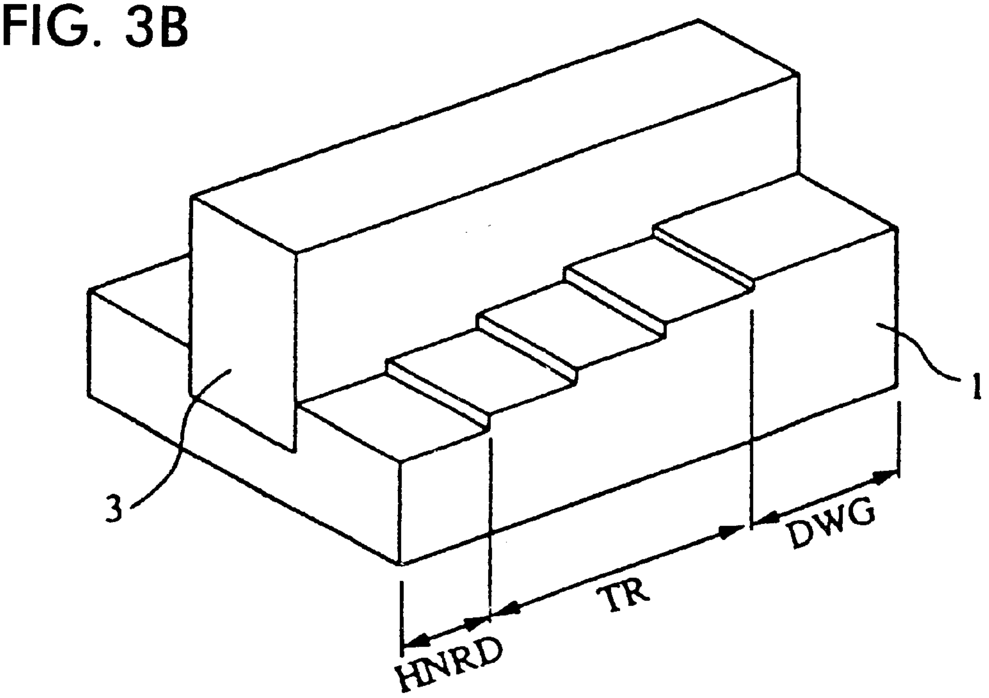

In FIGS. 3A–3B show the construction of a dielectric line converter according to a second embodiment. Unlike the first embodiment, in the example shown in FIGS. 3A–3B, the space between the opposing surfaces of the upper and lower conductor plates 1 and 2 is reduced stepwise in the line conversion portion from the space in the first-kind dielectric line to the space (nearly zero) in the second-kind dielectric line. In such a construction also, as the space between the opposing surfaces of the upper and lower conductor plates 1 and 2 changes in small steps, reflection is suppressed, so the total reflection characteristic can be kept good.

Next, the construction of a dielectric line converter according to a third embodiment is explained with reference to FIGS. 4A through 7.

Figure 4A:
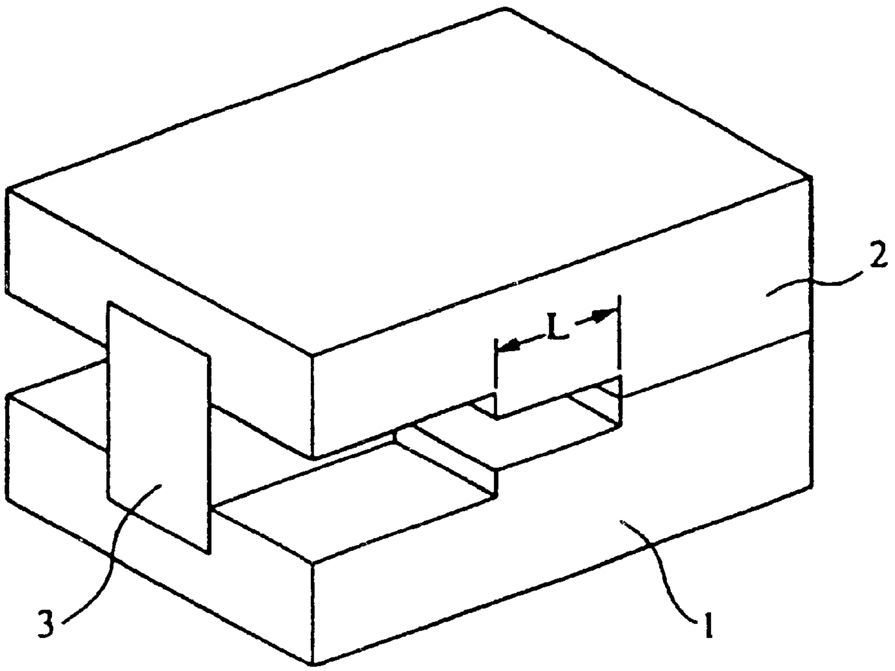
FIGS. 4A and 4B are perspective views showing the construction of a dielectric line converter according to a third embodiment.
Figure 4B:
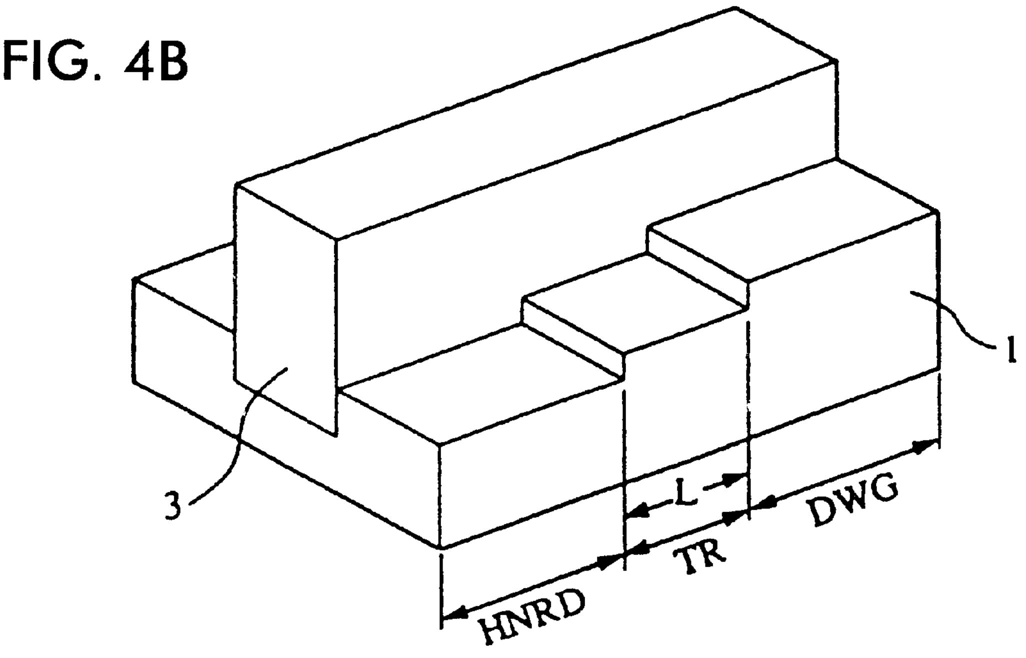

FIG. 4A is a perspective view of the whole converter, and FIG. 4B is a perspective view corresponding to FIG. 4A in which the upper conductor plate is removed. Reference numerals 1 and 2 each represent a respective conductor plate, and reference numeral 3 represents a dielectric stripline.

Figure 5A:
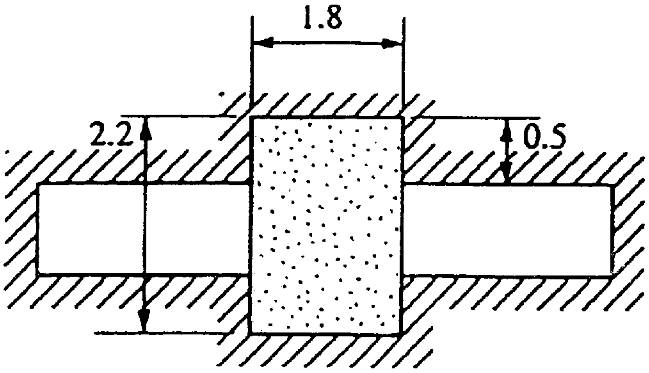
FIGS. 5A, 5B and 5C are sectional views of respective portions of the dielectric line converter shown in FIG. 4A.
Figure 5B:
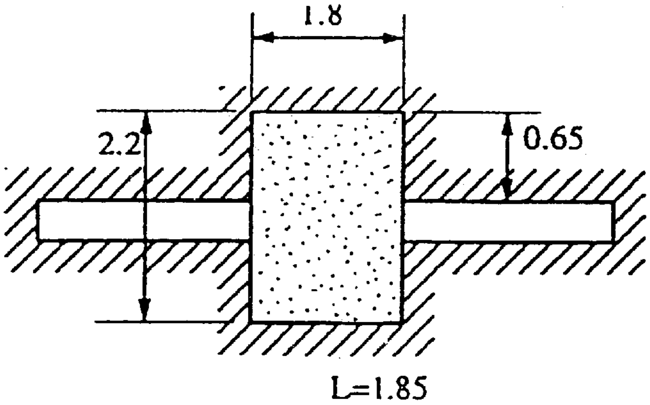
Figure 5C:
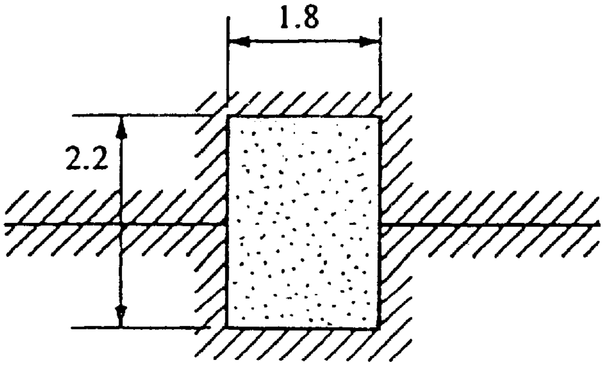

A sectional view of each portion is shown in FIGS. 5A–5C. FIG. 5A is a sectional view taken in the first-kind dielectric line, FIG. 5B is a sectional view taken in the line conversion portion, and FIG. 5C is a sectional view taken in the second-kind dielectric line. The height and width of the dielectric stripline 3 are 2.2 mm and 1.8 mm, respectively, and are constant in the first-kind dielectric line, second-kind dielectric line, and line conversion portion. The groove depth in the conductor plate of the first-kind dielectric line is 0.5 mm, the groove depth in the line conversion portion is 0.65 mm, and the groove depth in the second-kind dielectric line is 1.1 mm.

Figure 6:
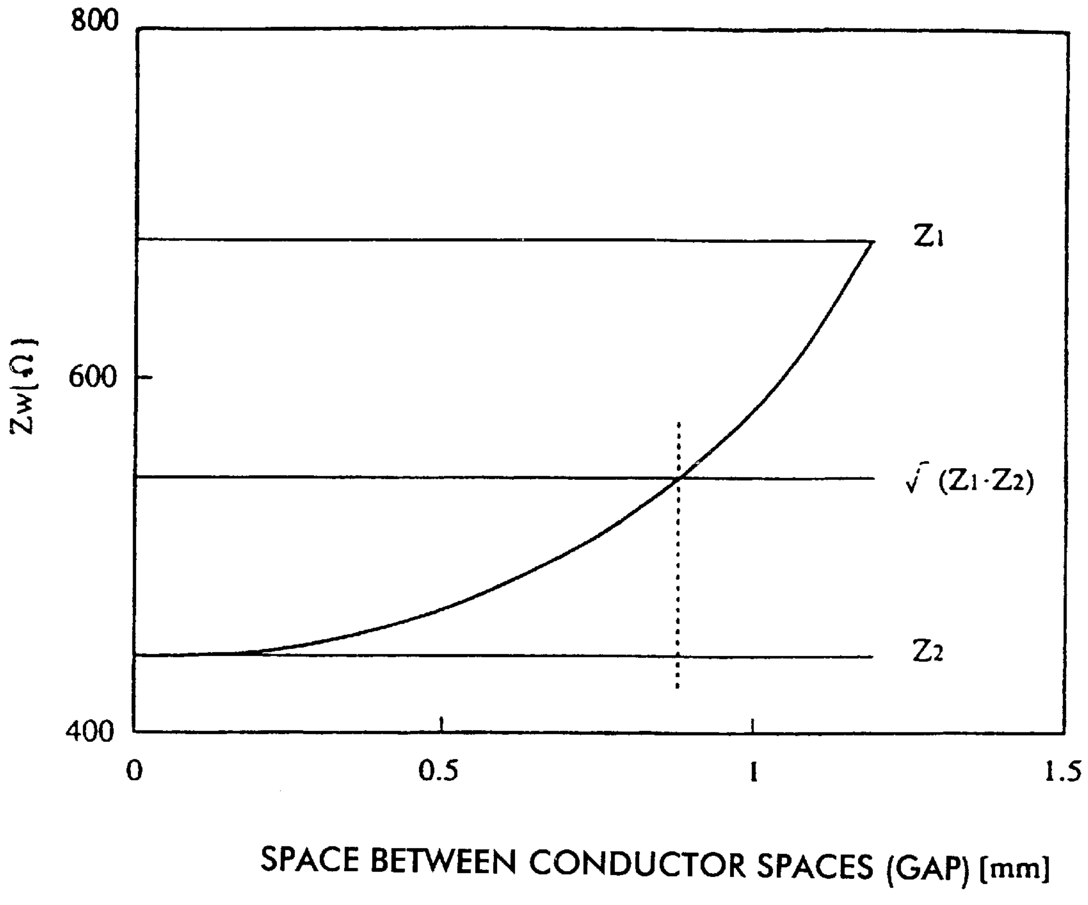
FIG. 6 is a graph showing the relationship of the characteristic impedance of the line to the space between the conductor surfaces.

The relationship of the characteristic impedance of the line to the space between the conductor surfaces of the upper and lower conductor plates 1 and 2 is shown in FIG. 6. Z1 represents the characteristic impedance of the first-kind dielectric line, and Z2 represents the characteristic impedance of the second-kind dielectric line. Impedance matching between the lines of the two kinds can be realized by setting the space between the conductor surfaces so that the characteristic impedance of the line conversion portion is given by $\sqrt{(Z1\cdot Z2)}$. In this example, the space between the conductor surfaces is 0.9 mm. And when the wavelength on the line is assumed to be $\lambda g$, the length L of the line conversion portion is set to be $\lambda/4$ or an odd multiple of $\lambda/4$. In the example, the wavelength is in the 60 GHz band and L is 1.85 mm.

Figure 7:
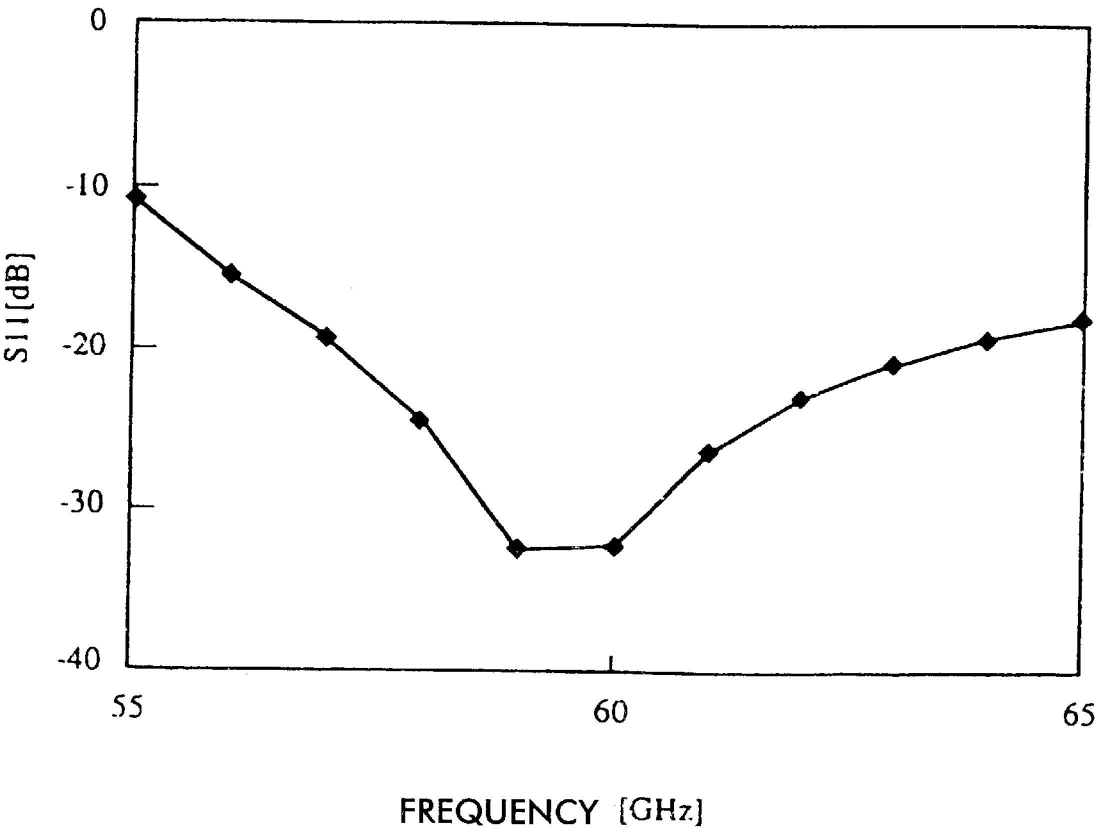
FIG. 7 is a graph showing the reflection characteristic in a fixed frequency band.

FIG. 7 shows the reflection characteristic of a dielectric line converter constructed as in FIGS. 4A–5C which is based on the three-dimensional finite element method. As shown, a low reflection characteristic of −30 dB can be obtained in the 60 GHz band.

Next, the construction of a dielectric line converter according to a fourth embodiment is explained with reference to FIGS. 8 through 11.

Figure 8:
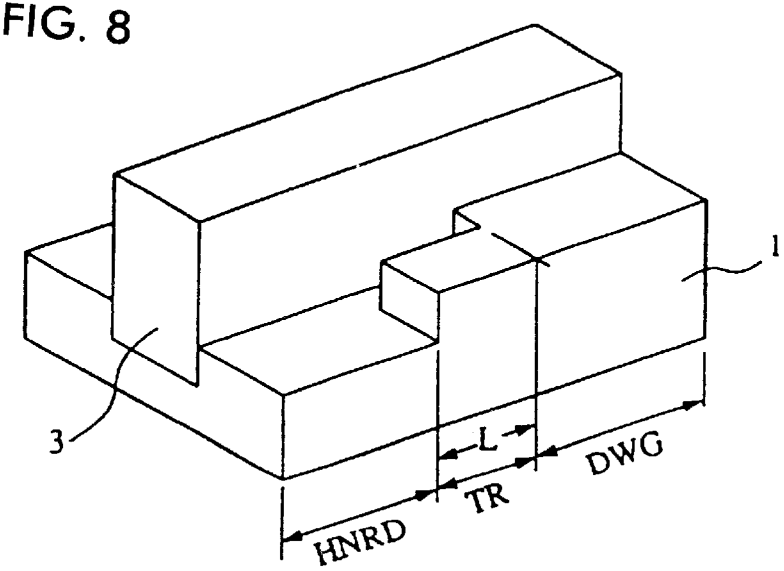
FIG. 8 is a perspective view showing the construction of a dielectric line converter according to a fourth embodiment.

FIG. 8 is a perspective view of a dielectric line converter with the upper conductor plate removed. In this example, the space between the upper and lower conductor plates in a first-kind dielectric line HNRD is kept constant, and the space between the upper and lower conductor plates in a second-kind dielectric line DWG is made nearly zero. However, in a line conversion portion TR, the space between the conductor plates along the sides of the dielectric stripline 3 is made the same as the space between the conductor plates in the first-kind dielectric line. Further, the space between the conductor plates in the rest of the line conversion portion (that is, the part of the line conversion portion further away from the dielectric stripline) is made the same as the space in the second-kind dielectric line.

Figure 9A:
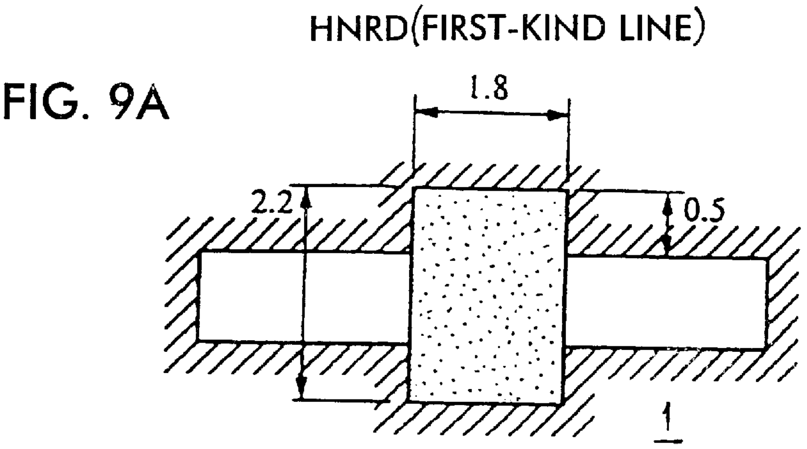
FIGS. 9A, 9B and 9C are sectional views of respective portions of the dielectric line converter of FIG. 8.
Figure 9B:
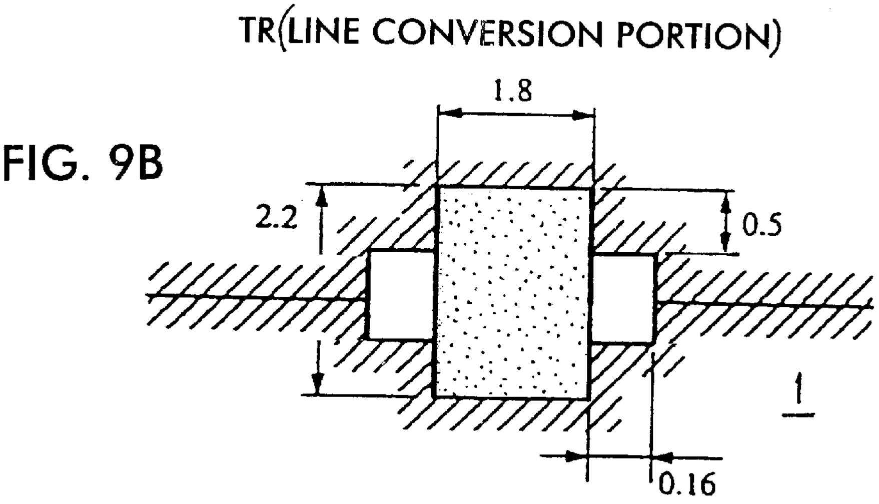
Figure 9C:
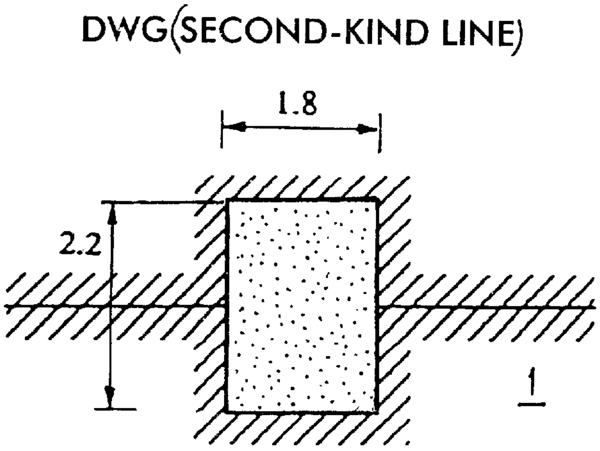

A sectional view of each portion of the above dielectric line converter is shown in FIGS. 9A–9C. FIG. 9A is a sectional view of the first-kind dielectric line, FIG. 9B is a sectional view of the line conversion portion, and FIG. 9C is a sectional view of the second-kind dielectric line. The height and width of the dielectric line 3 are 2.2 mm and 1.8 mm, respectively, and are constant in the first-kind dielectric line, second-kind dielectric line, and line conversion portion. The groove depth in the conductor plate in the first-kind dielectric line is 0.5 mm. The groove depth in the line conversion portion is also 0.5 mm, and the distance from the dielectric line 3 to the side conductor surface is 0.16 mm. The groove depth in the second-kind dielectric line is 1.1 mm.

Figure 10:
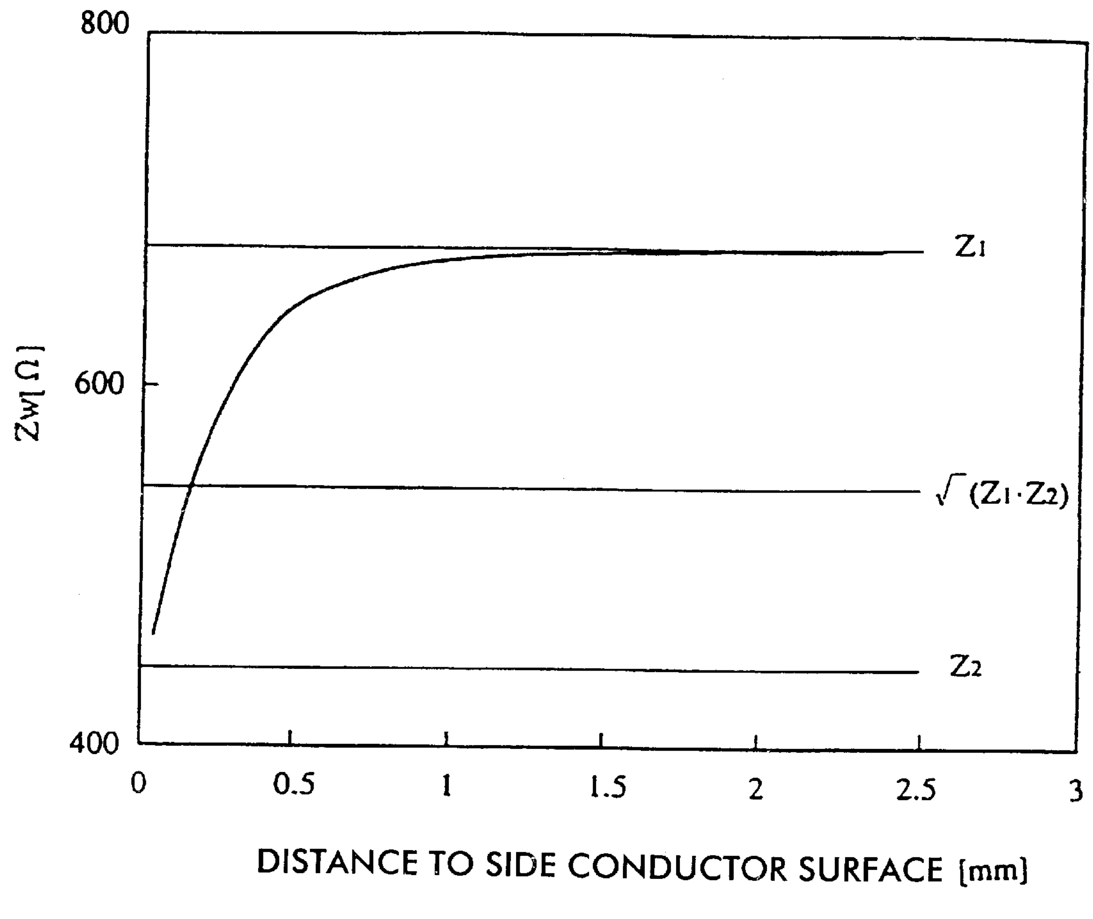
FIG. 10 is a graph showing the relationship of the characteristic impedance of the line to the distance to the side conductor surface away from the dielectric stripline.

The relationship of the characteristic impedance of the line to the distance from the dielectric stripline to the side conductor surface is shown in FIG. 10. Z1 represents the characteristic impedance of the first-kind dielectric line, and Z2 represents the characteristic impedance of the second-kind dielectric line. Impedance matching between the lines of the two kinds can be realized by setting the distance from the dielectric stripline to the side conductor surface so that the characteristic impedance of the line conversion portion is given by $\sqrt{(Z1 \cdot Z2)}$. In this example, the distance is 0.16 mm. And when the wavelength on the line is assumed to be $\lambda g$, the line length L of the line conversion portion is set to be $\lambda/4$ or an odd multiple of $\lambda/4$. In the example, the wavelength is in the 60 GHz band and L is 1.83 mm.

Figure 11:
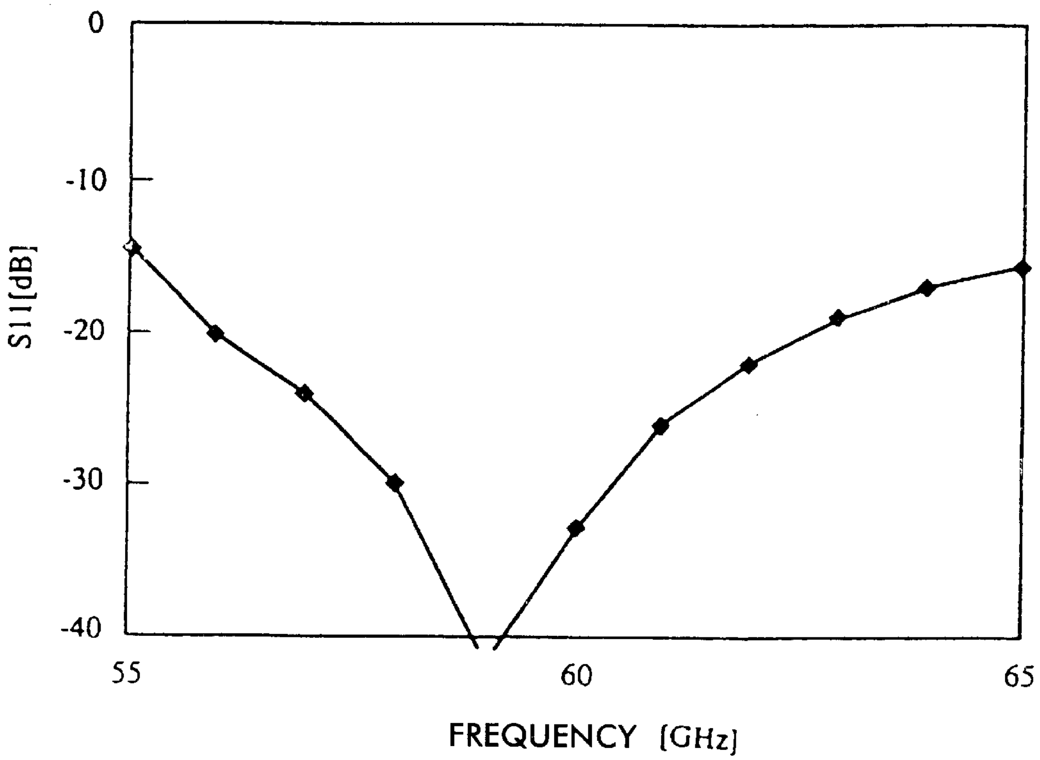
FIG. 11 is a graph showing the reflection characteristic in a fixed frequency band.

FIG. 11 shows the reflection characteristic of a dielectric line converter constructed as in FIGS. 8–9C which is based on the three-dimensional finite element method. As shown, a low reflection characteristic of −30 dB can be obtained in the 60 GHz band.

Next, an example of the construction of a directional coupler according to a fifth embodiment is explained with reference to FIGS. 12 through 14.

Figure 12:
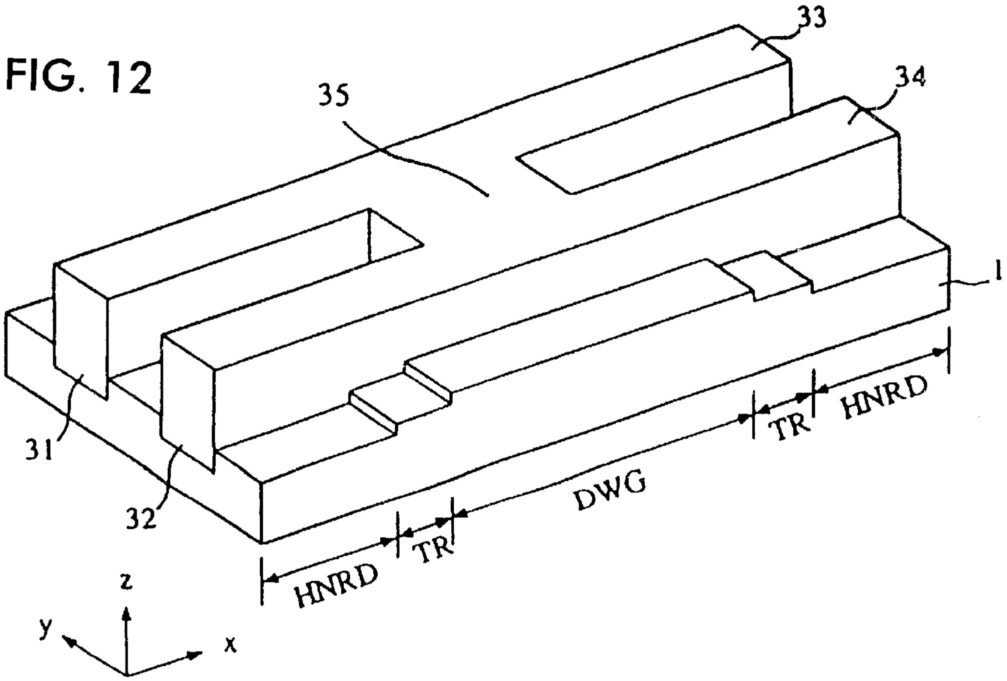
FIG. 12 is a perspective view showing an example of the construction of a directional coupler according to a fifth embodiment.
Figure 13:
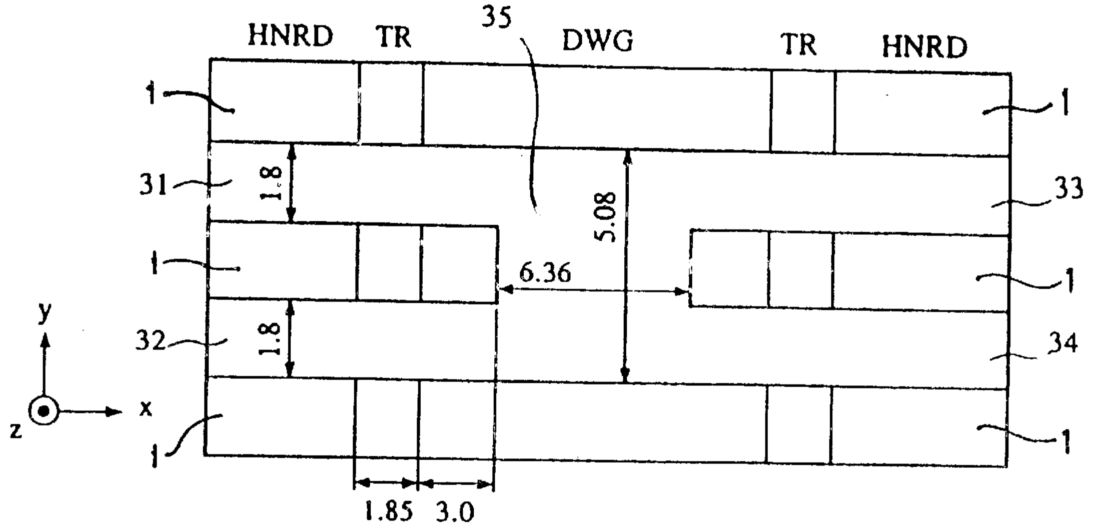
FIG. 13 is a top view of the directional coupler of FIG. 12 with the upper conductor plate removed.

FIG. 12 is a perspective view of a directional coupler with the upper conductor plate removed, and FIG. 13 is its top view. The portions indicated by 31, 32, 33, and 34 are dielectric striplines, and in the example they are integrally molded substantially in a H-shape such that they are joined at a coupling portion 35. The dielectric striplines 31 through 34 are fitted to a certain depth in grooves in the conductor plate 1. The upper conductor plate (not shown) has the same construction as the lower conductor plate 1.

As constructed this way, from the dielectric stripline 32 to the dielectric stripline 34, the line conversion takes place in a first-kind dielectric line, a line conversion portion, a second-kind dielectric line, a line conversion portion, and a first-kind dielectric line, in that order. In like manner, from the dielectric stripline 31 to the dielectric stripline 33, the line conversion takes place in a first-kind dielectric line, a line conversion portion, a second-kind dielectric line, a line conversion portion, and a first-kind dielectric line, in that order.

The above dielectric striplines are integrated together at the coupling portion 35, which extends between the portions constituting the second-kind dielectric lines. Because of this, the second-kind dielectric lines function as a DWG-type directional coupler. The DWG-type directional coupler shows a broad-band characteristic in the same way as a directional coupler using a cavity waveguide. Furthermore, as the four dielectric striplines 31–34 can be hyper-NRDs, when the directional coupler of FIG. 12 is included in a dielectric line circuit using hyper-NRD guides, the whole circuit can be made small-sized.

In the above directional coupler, the space between the upper and lower conductor plates in the first-kind and second-kind dielectric lines and the space between the upper and lower conductor plates in the line conversion portions are the same as in the example shown as the third embodiment in FIG. 5. And the dimensions and materials of the dielectric striplines are the same as in the third embodiment. The dimensions of each portion shown in FIG. 13 are the values for a directional coupler designed for the 60 GHz band, and they are expressed in units of mm.

Figure 14:
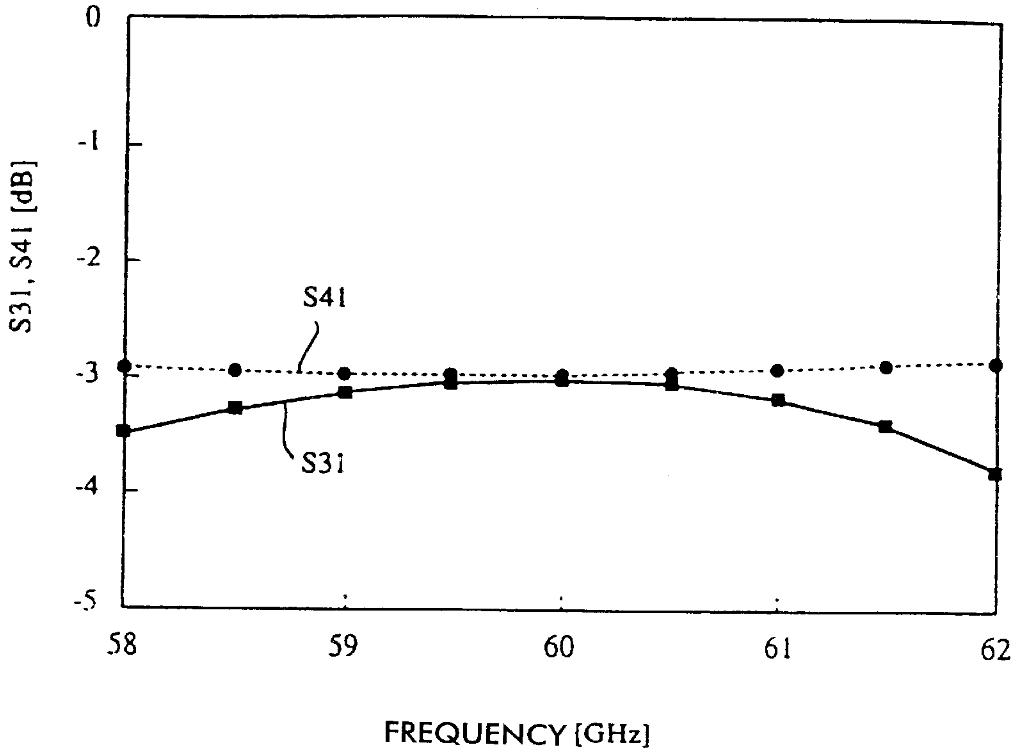
FIG. 14 shows the distribution characteristic of the directional coupler.

FIG. 14 shows the distribution characteristic based on the three-dimensional finite element method. In the 60 GHz band, the S31 and S41 characteristics (a signal input to the first port as seen at the third and fourth ports, respectively) are within −3 dB to result in an equal distribution characteristic, and, furthermore, the characteristic is maintained over a broad band.

Next, an example of a directional coupler according to a sixth embodiment is explained with reference to FIGS. 15 through 19.

Figure 15:
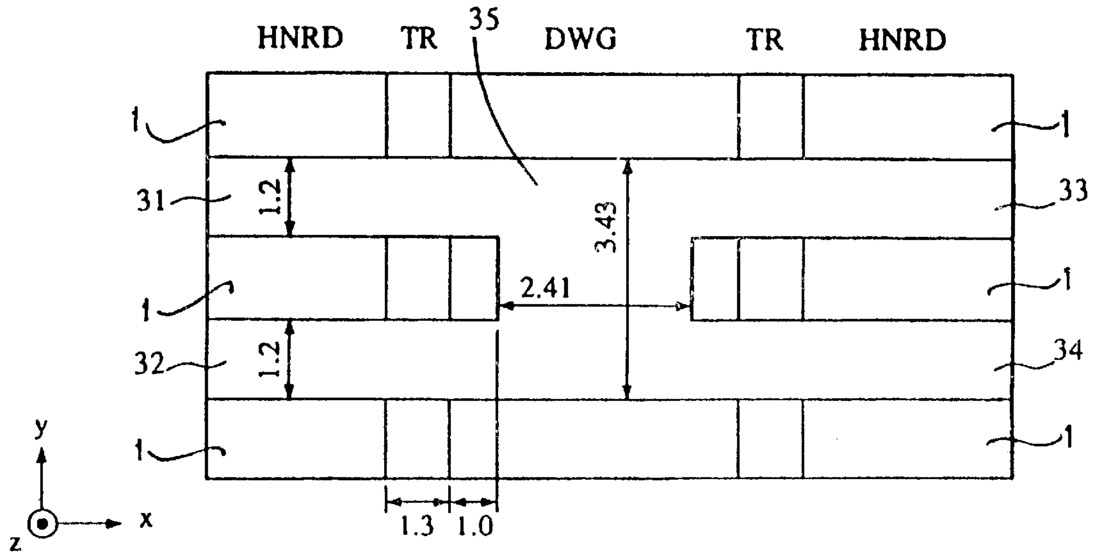
FIG. 15 shows an example of the construction of a directional coupler according to a sixth embodiment.

FIG. 15 is a top view of a directional coupler with the upper conductor plate removed. The directional coupler is basically the same as what is shown in FIG. 13, but the directional coupler shown here is to be used in the 76 GHz band. As the directional coupler is to be used in the higher frequency band, the length of the TR conversion portion is 1.3 mm and in the second-kind dielectric lines the dimensions of the portions 35 which couple the parallel dielectric striplines are made smaller than those shown in FIG. 13.

Figure 16A:
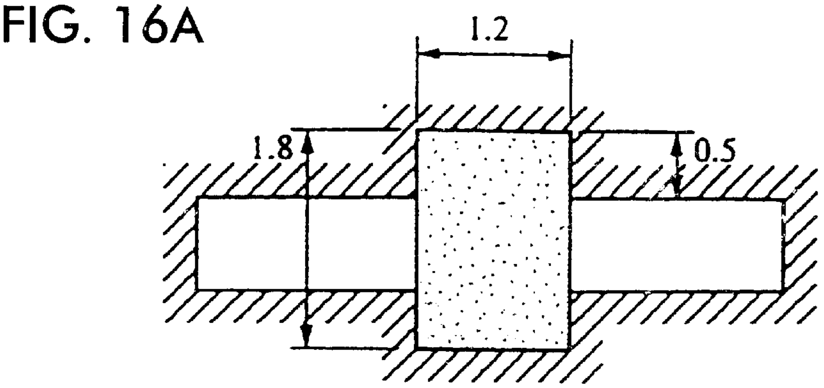
FIGS. 16A, 16B and 16C are sectional views of respective portions of the directional coupler of FIG. 15.
Figure 16B:
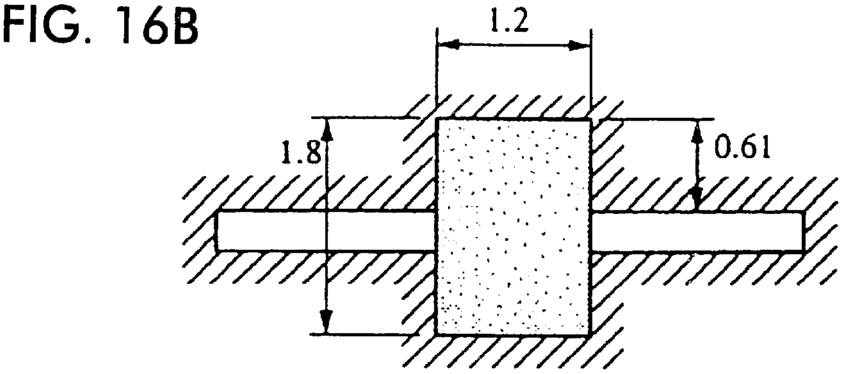
Figure 16C:
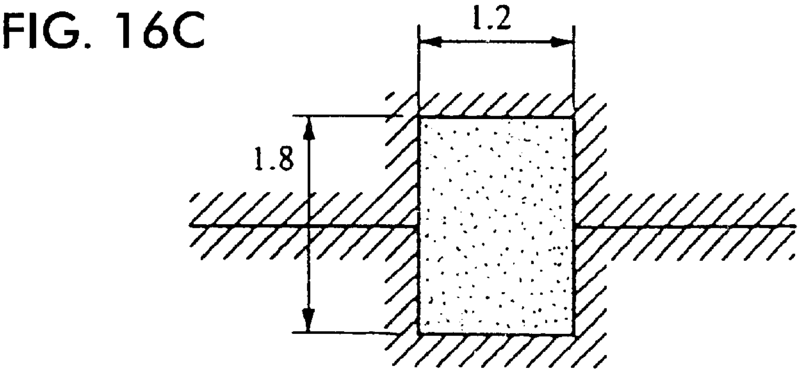

FIGS. 16A–C show sectional views of the three kinds of line portions in the directional coupler of FIG. 15. FIG. 16A is a sectional view of the first-kind dielectric line, FIG. 16B is a sectional view of the line conversion portion, and FIG. 16C is a sectional view of the second-kind dielectric line. As the directional coupler is used in the higher frequency band, the dimensions of each portion are made smaller than those shown in FIGS. 5A–5C, respectively.

Figure 17:
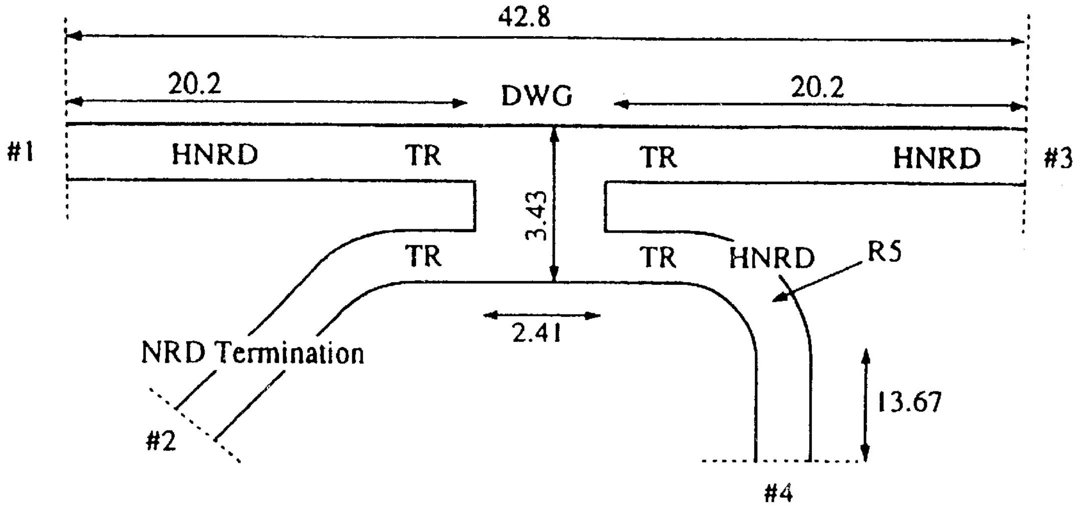
FIG. 17 schematically shows the construction of a directional coupler used in an actual measurement.

FIG. 17 shows the construction of a directional coupler the characteristics of which were practically investigated, and is a top view of only the dielectric stripline portion. In this directional coupler, the power of the input signal from port No. 1 is distributed to port No. 3 and port No. 4. Because the hyper-NRD guides are formed entirely outside the conversion portion TR, even if a bend of an arbitrary curvature is constructed, scarcely any mode conversion losses occur. In the example, a bend having a radius of curvature of 5 mm (R5) is formed in order to lead out port No. 4 in a direction at a right angle to a straight line connecting port No. 1 and port No. 3.

Figure 18:
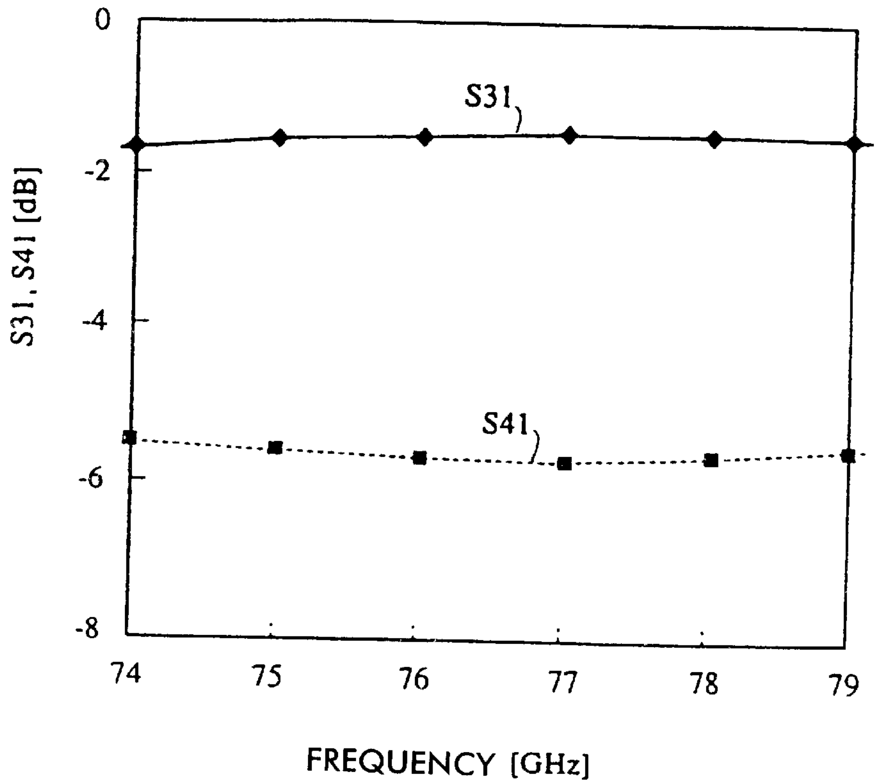
FIG. 18 shows distribution characteristics of the directional coupler of FIG. 15 obtained through simulation.
Figure 19:
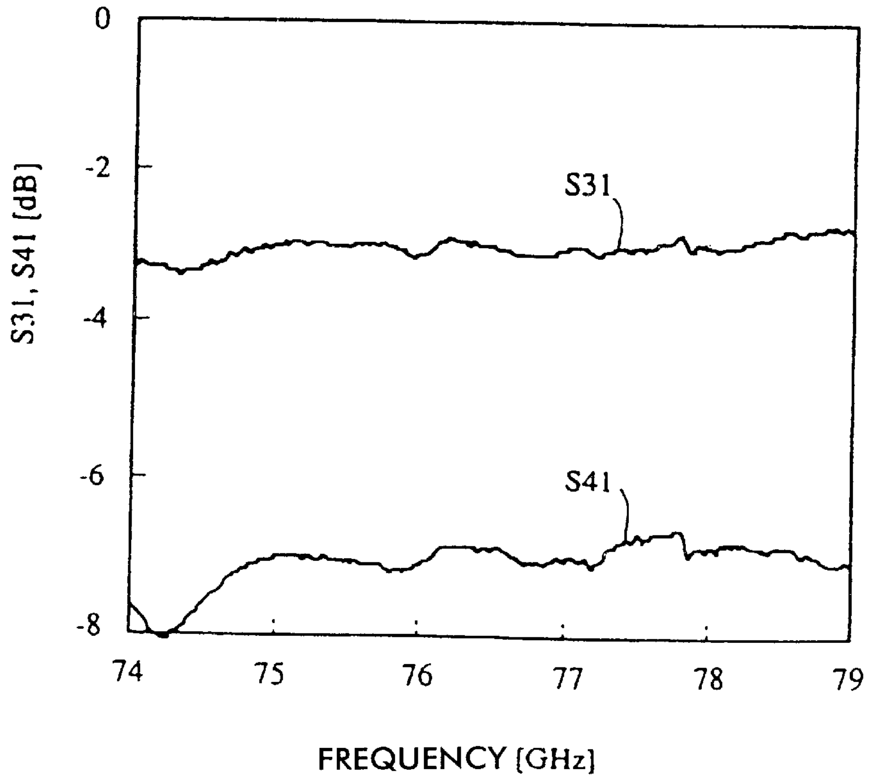
FIG. 19 shows distribution characteristics obtained by actual measurement of the directional coupler of FIG. 17.

FIG. 18 shows the simulated characteristics of the directional coupler shown in FIG. 15 which was simulated as no loss system using the three-dimensional finite element method. FIG. 19 is the result of an actual measurement of the directional coupler shown in FIG. 17. It is able to make the power distribution ratio nearly constant over a broad frequency band.

Figure 20:
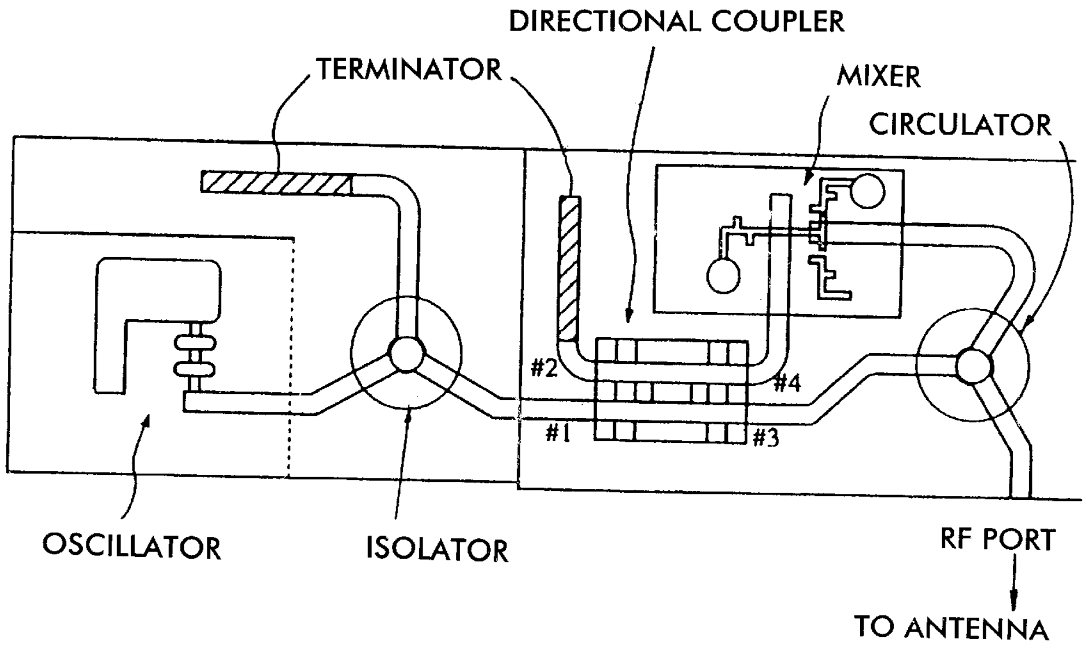
FIG. 20 shows the construction of a millimeter wave radar module according to a seventh embodiment.
Figure 21:
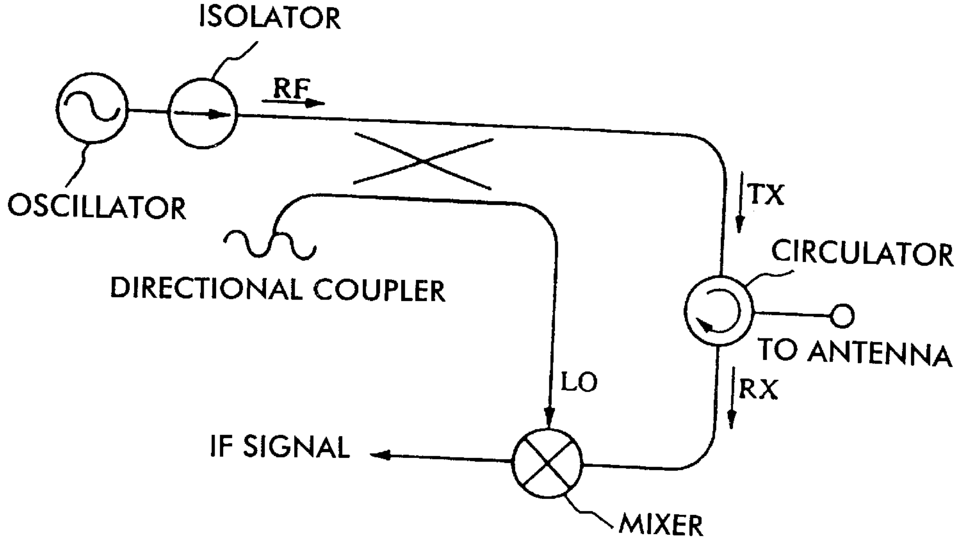
FIG. 21 is a block diagram of the millimeter wave radar module of FIG. 20.

Next, based on FIGS. 20 and 21, an example of the construction of a millimeter wave radar module according to a seventh embodiment is explained. FIG. 20 is a top view of the module with the upper conductor plate removed, and FIG. 21 is a schematic block diagram of the millimeter wave radar module of FIG. 20.

The millimeter wave radar module is principally made up of an oscillator, an isolator, a directional coupler, a circulator, and a mixer. In the oscillator, a millimeter wave signal is generated by a Gunn diode. The isolator is made up of a terminator connected to one port of the circulator which interconnects three dielectric striplines as shown in the figure. That is, in the isolator, the millimeter wave signal from the oscillator is propagated to the directional coupler, and the reflected signal from the directional coupler is led to the terminator. The directional coupler is of the same construction as that shown in FIG. 12, and has four ports each comprising a hyper-NRD guide to distribute an input signal from port No. 1 to port No. 3 and port No. 4 in a fixed power distribution ratio. The signal from port No. 3 is radiated as a TX signal toward a target from an antenna connected to an RF port through the circulator. The reflected signal from the target which the antenna receives is input as an RX signal to the mixer through the circulator. On the other hand, a signal from port No. 4 of the directional coupler is input to the mixer as an LO signal, and the mixer mixes the RF signal and LO signal. The oscillator generates signals having either of two different frequencies f1 and f2 over the course of time. The operation of the millimeter wave radar module of FIGS. 20–21 will be easily understood by those having the ordinary level of skill in the art.

Figure 22:
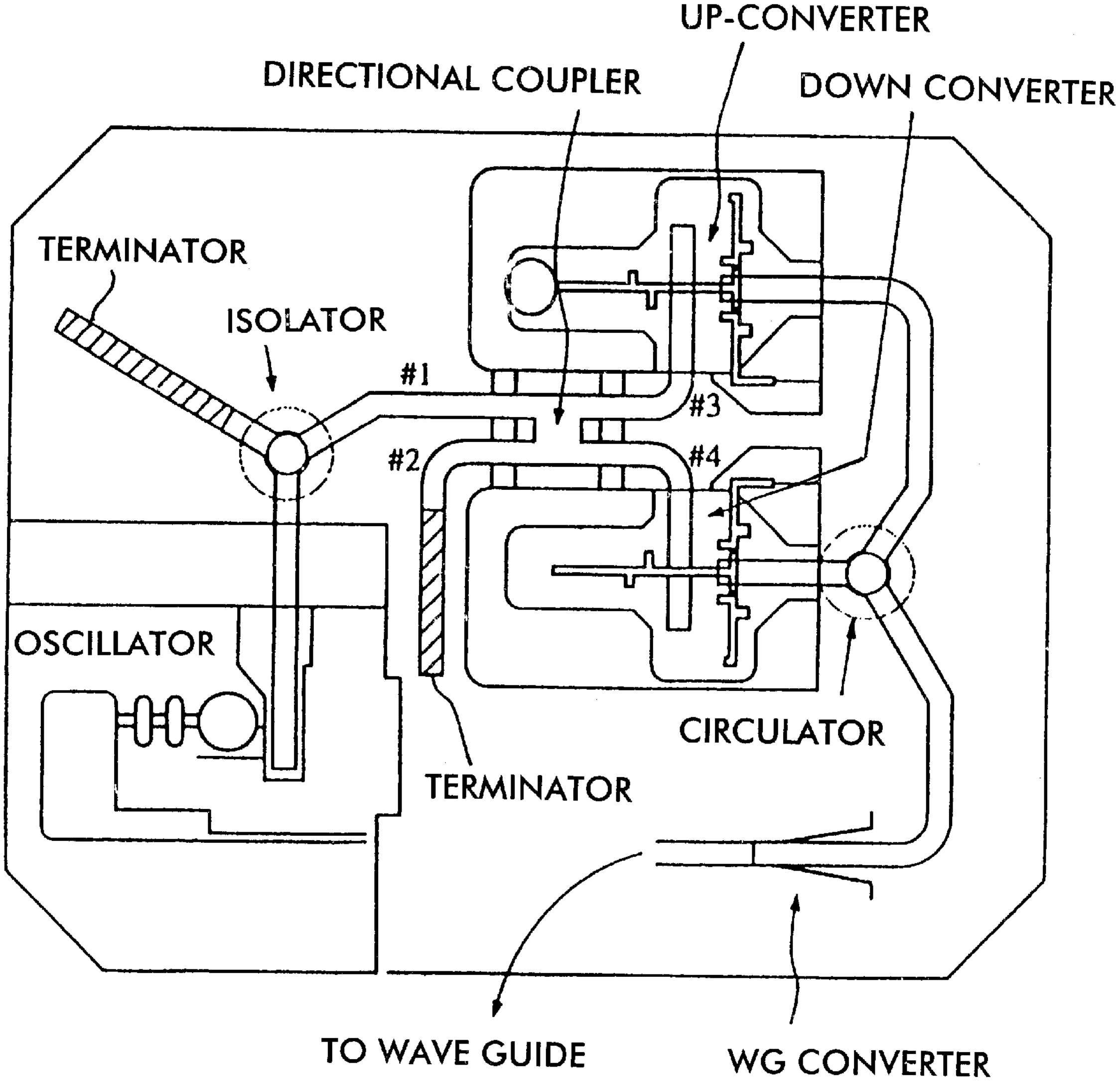
FIG. 22 shows the construction of a millimeter wave radar module according to an eighth embodiment.
Figure 23:
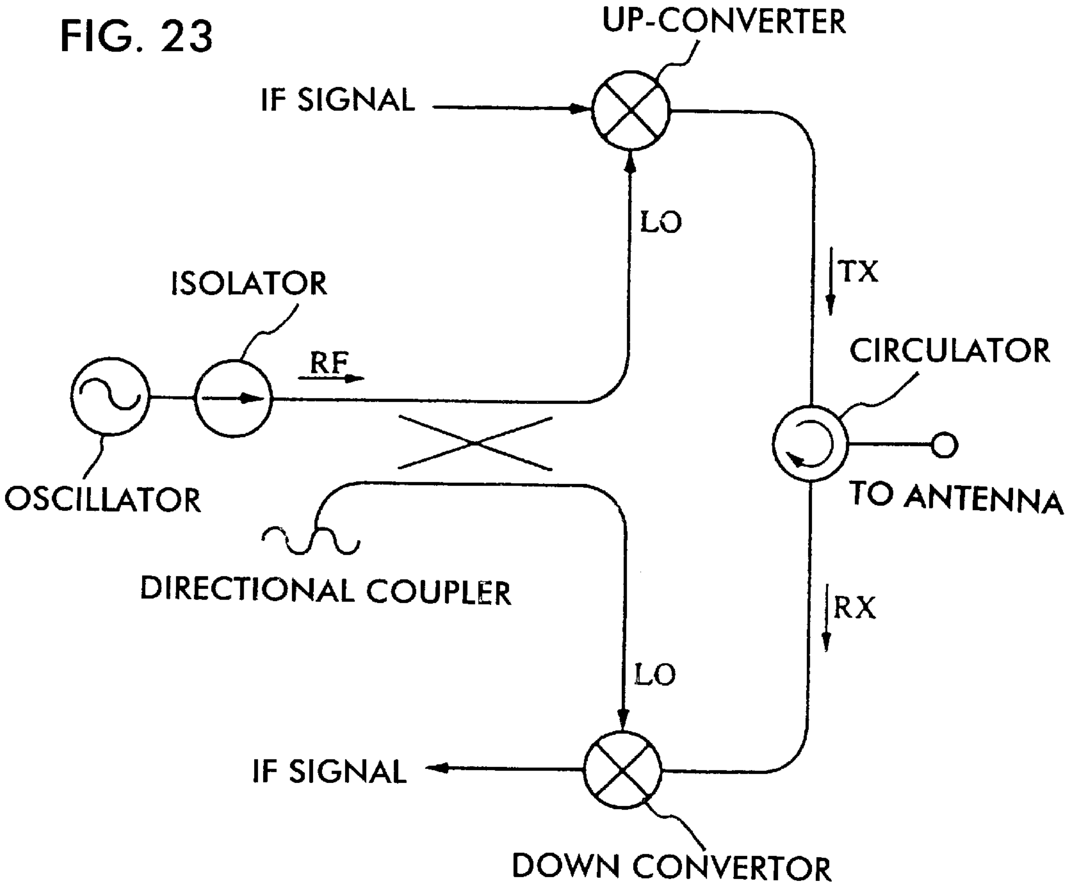
FIG. 23 is a block diagram of the millimeter wave radar module of FIG. 22.

Next, the construction of a millimeter wave radar module according to an eighth embodiment is shown in FIG. 22 and 23. FIG. 22 is a top view with the upper conductor plate removed, and FIG. 23 is a block diagram of the millimeter wave radar module.

The millimeter wave radar module is principally made up of an oscillator, an isolator, a directional coupler, a circulator, an up-converter, and a down converter. In the oscillator, a millimeter wave signal is generated by a Gunn diode. The isolator is made up of a terminator connected to one port of a circulator which connects three dielectric striplines as shown in the figure. In the isolator the millimeter wave signal from the oscillator is propagated to the directional coupler and the reflected signal from the directional coupler is led to the terminator. The signal input to port No. 1 of the directional coupler is output from port No. 3 and port No. 4, to the up-converter and the down converter, respectively. The up-converter mixes an LO signal from the directional coupler and an IF signal from an IF circuit (not shown) and outputs a sum signal whose frequency is the sum of the LO frequency and the IF frequency to the circulator. This signal from the up-converter is then output through the circulator to a waveguide through a WG converter to convert a hyper-NRD guide to a waveguide. From the waveguide, the signal is then radiated as a TX signal from an antenna (not shown). The signal reflected from a target is input as an RX signal from the antenna into the down converter through the circulator. The down converter mixes the LO signal from the oscillator and the RX signal and an IF signal containing an RX–LO component is obtained. By processing the frequency difference between the IF signal given to the up-converter and the frequency component of the IF signal obtained from the down converter, the distance to the target is measured.

Figure 24:
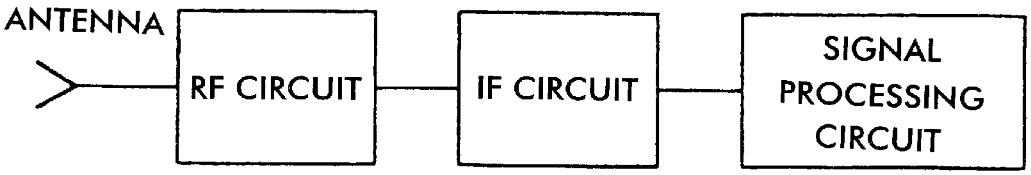
FIG. 24 is a block diagram of a transmitter-receiver according to a ninth embodiment.

FIG. 24 is a block diagram showing the construction of an entire transmitter-receiver according to a ninth embodiment, in which one of the above two millimeter wave radar modules is used. In FIG. 24, the RF circuit corresponds to the above millimeter wave radar module, and the IF circuit is made up of a filter circuit and an A/D converter for converting the IF signal obtained from the millimeter wave radar module to a digital signal. The signal processing circuit measures the distance from the antenna of the millimeter wave radar module to the target and calculates the relative speed by processing the digital signal, and when required, also controls external circuits such as mobile engine control units, and so on.

Figure 25:
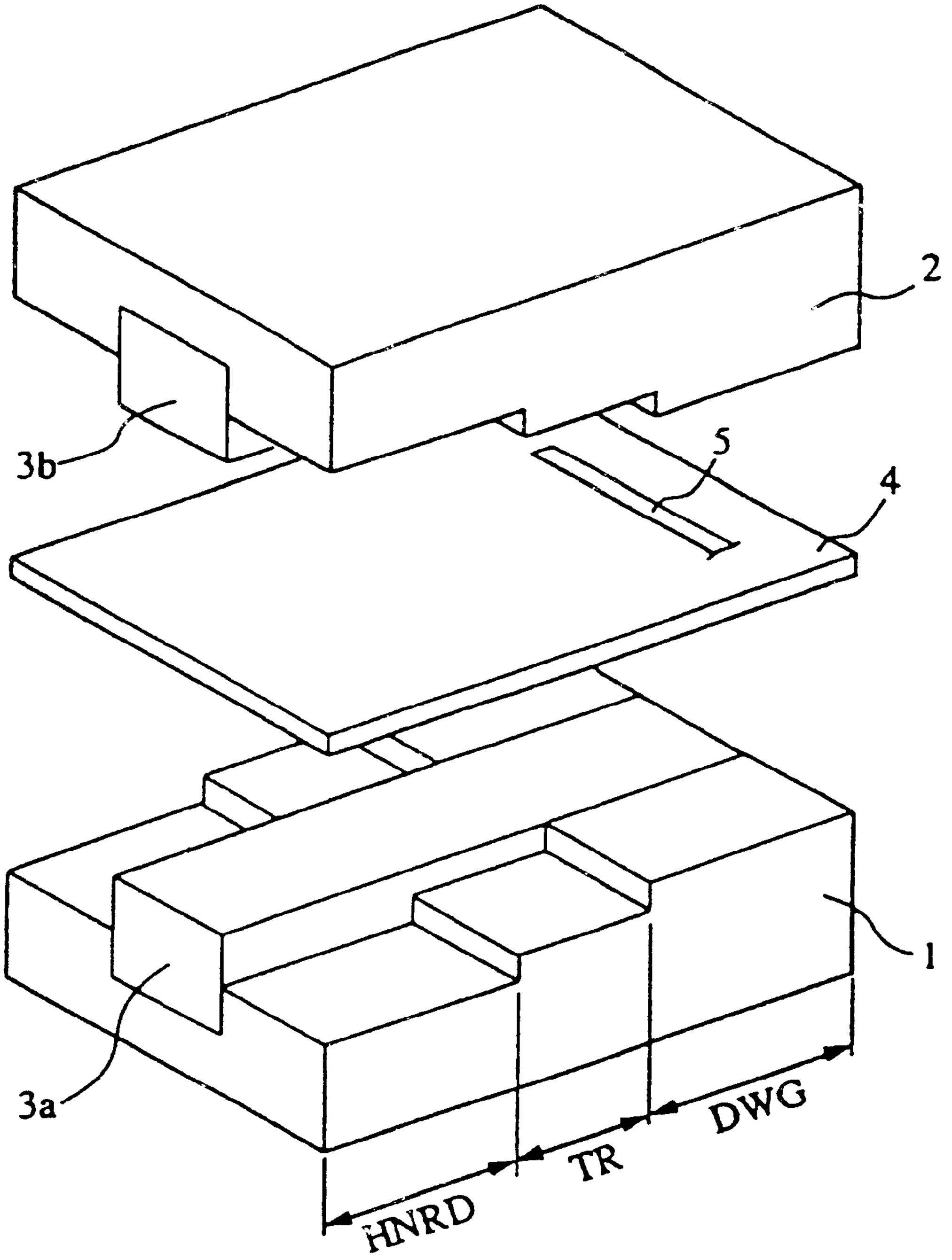
FIG. 25 is an exploded view in perspective showing an example of the construction of a dielectric line unit according to a tenth embodiment.

Next, the construction of a dielectric line unit according to a tenth embodiment is shown in FIG. 25. In FIG. 25, reference numerals 1 and 2 represent lower and upper conductor plates, and 3*a* and 3*b* represent lower and upper dielectric striplines, respectively. Further, 4 represents a board in which a microstrip line 5, and other elements not shown, are formed. The board 4 sandwiched between the lower and upper conductor plates 1 and 2 and the dielectric striplines 3*a* and 3*b* constitutes a dielectric line unit. This dielectric line unit corresponds to a unit having the construction shown in FIG. 4 which in addition is divided in the middle into upper and lower portions with the board sandwiched therebetween.

By inserting the microstrip line 5 at a right angle to the DWG line, a line conversion is realized between the microstrip line 5 and the DWG line. Generation of unwanted waves is reduced by such a line conversion between the DWG and microstrip line, compared with the case in which a direct line conversion is carried out between an NRD guide and a microstrip line. Note that a hollow portion (not shown) is formed in the portion of the conductor plate 2 which is opposed to the microstrip line 5 so that the microstrip line 5 is not placed in direct contact with the upper conductor plate 2.

In each of the embodiments shown above, a line conversion is performed between a hyper-NRD guide and a dielectric-loaded waveguide. However, the invention is equally applicable to a line conversion between a normal NRD guide and a dielectric-loaded waveguide in which both an LSM01 mode and an LSE01 mode are propagated. An example is shown as an eleventh embodiment of the invention in FIGS. 26A–26C.

Figure 26A:
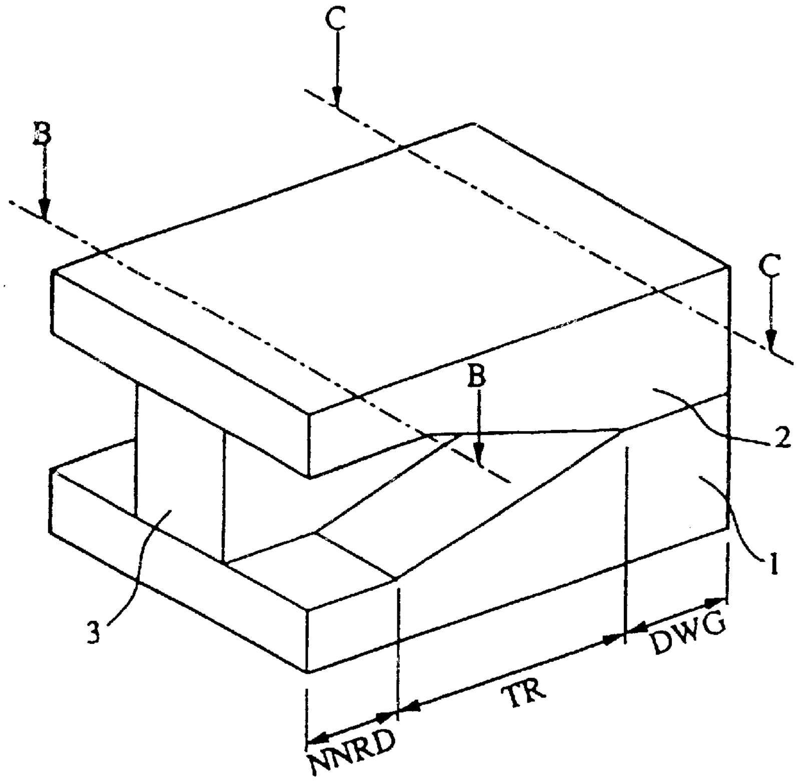
FIG. 26A is a perspective view and FIGS. 26B and 26C are sectional views taken along lines B—B and C—C in FIG. 26A, respectively, showing the construction of a dielectric line converter according to an eleventh embodiment.
Figure 26B:
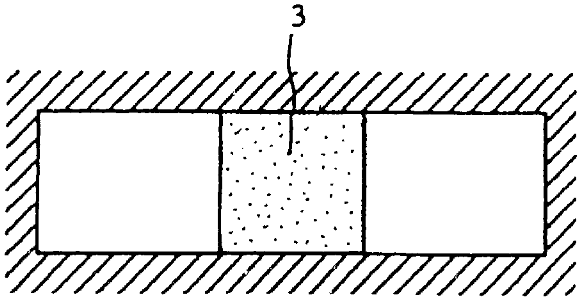
Figure 26C:
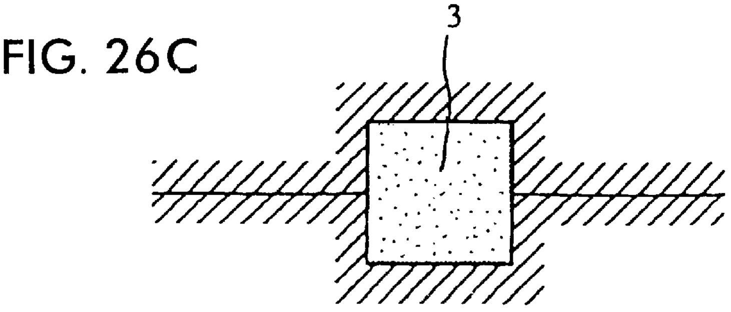

FIG. 26A is a perspective view of the whole converter, FIG. 26B is a sectional view taken on line B—B of FIG. 26A, and FIG. 26C is a sectional view taken on line C—C of FIG. 26A. Unlike the construction shown in FIGS. 1A–1B, in the normal NRD guide in this example, no groove is formed in the upper and lower conductor plates 1 and 2.

In the line conversion portion (TR), the groove depth is gradually increased from zero so that the space between the opposing surfaces of the upper and lower conductor plates 1 and 2 becomes tapered from the normal NRD guide to the DWG.

In each of the embodiments shown above, the conductor surface of a dielectric line was made up of the surface of a conductor plate. However, the conductor surface may be formed by metallizing a fixed portion of a dielectric stripline. As an example, a directional coupler, according to a twelfth embodiment of the invention is shown in FIGS. 27A and 27B.

Figure 27A:
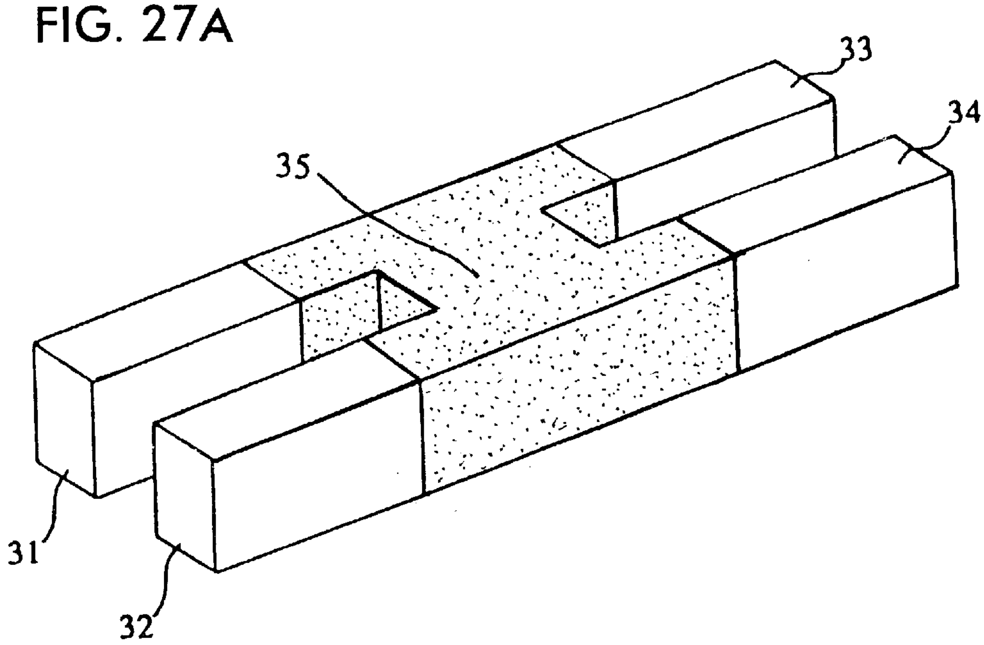
FIGS. 27A and 27B are perspective views showing the construction of a directional coupler according to a twelfth embodiment.
Figure 27B:
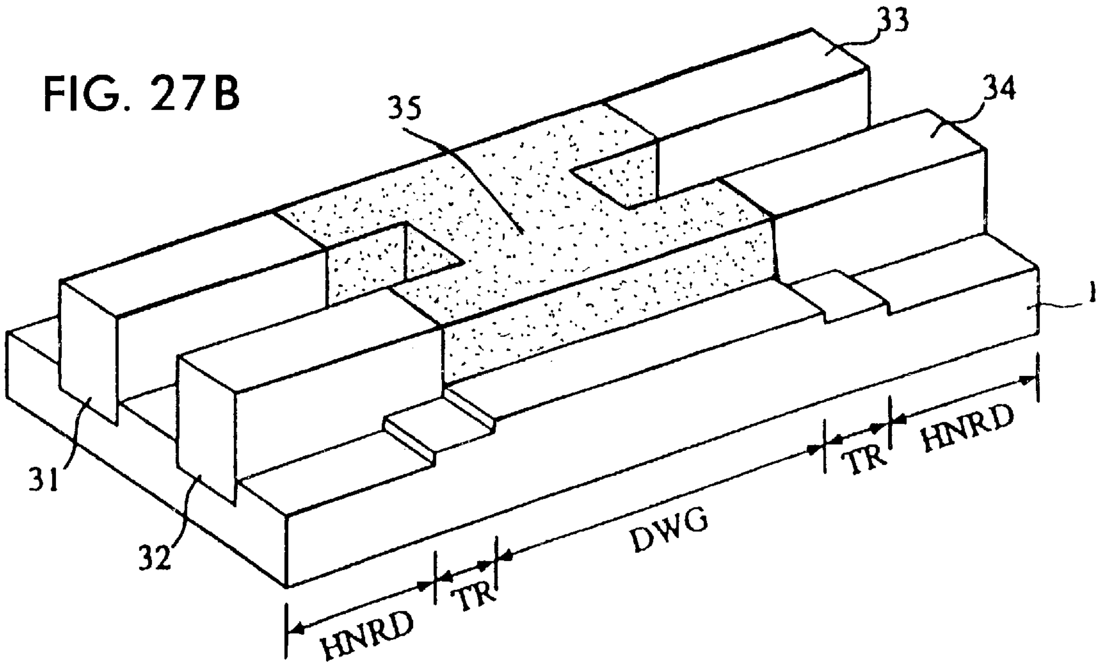

FIG. 27A is a perspective view of a dielectric stripline, and FIG. 27B is a perspective view of the directional coupler with the upper conductor plate removed. The portions indicated by 31, 32, 33, and 34 are dielectric lines, and 35 indicates a coupling portion, but unlike the example shown in FIG. 12 an electrode film is formed on the dielectric stripline portion constituting the DWG. The construction of the other portions is the same as in FIG. 12.

Because of this construction, in the DWG portion the metallized electrode functions as a conductor surface, and accordingly even if the spacing between the dielectric stripline and the conductor plates in the DWG portion becomes larger or smaller, a stable characteristic can be always realized.

According to a first aspect of the present invention, because the discontinuity from a first-kind dielectric line to a second-kind dielectric line is lessened, a line conversion is made without deterioration of reflection characteristics.

Furthermore, as the line does not need to be widened in the line conversion portion, a dielectric line converter which is small-sized in its width direction can be obtained.

According to a second aspect of the present invention, there is less reflection at the discontinuity from a first-kind dielectric line to a second-kind dielectric line.

According to a third aspect of the present invention, reflected waves at two discontinuity portions are superposed in opposite phase, and as a result the reflected waves are canceled. Because of this the reflection characteristic is improved.

According to a fourth aspect of the present invention, because the space between the upper and lower conductor surfaces sandwiching a dielectric stripline is changed stepwise from a first-kind dielectric line to a second-kind dielectric line, a short line converter can be obtained.

According to a fifth aspect of the present invention, a dielectric line circuit comprising both an NRD guide and a DWG can be easily constructed. If the input-output portions are provided by the NRD guides, there is practically no mode conversion loss even if the input-output portions are bent.

According to a sixth aspect of the present invention, a DWG-type element can be connected in a dielectric line circuit which consists mainly of NRD guides, and as a result it becomes possible to make the whole circuit small, even though it includes the DWG element.

According to a seventh aspect of the present invention, because the input and output portions of a SWG-type directional coupler can be NRD guides, a directional coupler having broad-band characteristics and of small size can be realized.

According to an eighth aspect of the present invention, a small-sized broad-band high-frequency circuit module in which a directional coupler or dielectric line unit is used for propagation of a transmission signal or reception signal can be easily constructed.

According to a ninth aspect of the present invention, a small-sized broad-band transmitter-receiver comprising the high-frequency circuit module, transmission circuit, and reception circuit can be constructed.

While the invention has been particularly shown and described with reference to preferred embodiments, it will be understood by those skilled in the art that the foregoing and other changes in form and details can be made without departing from the spirit and scope of the invention.

What is claimed is:

1. A dielectric line converter comprising:

a dielectric stripline; an upper conductor surface and a lower conductor surface sandwiching said dielectric stripline;

the upper and lower conductor surfaces having a first spacing in a first region along said dielectric stripline so as to form a first dielectric line, a second spacing which is substantially zero in a second region so as to form a second dielectric line, and a third spacing which is less than said first spacing in a line conversion region between said first and second regions.

2. A dielectric line converter as claimed in claim 1, wherein said dielectric stripline extends continuously in said first region, said second region, and said line conversion region.

3. A dielectric line converter as claimed in claim 1, wherein said third spacing decreases continuously from said first region to said second region.

4. A dielectric line converter as claimed in claim 1, wherein said upper and lower conductor surfaces have at least one step in said line conversion region so that said third spacing decreases stepwise from said first region to said second region.

5. A dielectric line converter as claimed in claim 1, wherein said upper and lower conductor surfaces have a constant spacing in said line conversion region which is less than said first spacing, said first, second and third spacings are such that said line conversion region provides impedance matching at a predetermined wavelength between said first and second dielectric lines, and the length of said line conversion region is substantially one-fourth or an odd multiple of one-fourth of said wavelength.

6. A dielectric line converter comprising:

a dielectric stripline; an upper conductor surface and a lower conductor surface sandwiching said dielectric stripline;

the upper and lower conductor surfaces having a first spacing in a first region along said dielectric stripline so as to form a first dielectric line, a second spacing which is substantially zero in a second region so as to form a second dielectric line, and in a line conversion region between said first and second regions, said upper and lower conductor surfaces having said first spacing in proximal side regions adjacent to said dielectric stripline, and having said second spacing in distal side regions spaced away from said dielectric stripline.

7. A dielectric line converter as claimed in claim 6, said first and second spacings being such that said line conversion region provides impedance matching at a predetermined wavelength between said first and second dielectric lines, and the length of said line conversion region is substantially one-fourth or an odd multiple of one-fourth of said wavelength.

8. A dielectric line converter as claimed in any one of claims 1–7, wherein said first spacing between said upper and lower conductor surfaces in said first region is less than a height of said dielectric stripline so that in said first dielectric line a cutoff frequency of an LSM01 mode is lower than a cutoff frequency of an LSE01 mode and as a result the first dielectric line propagates substantially only the LSM01 mode.

9. A dielectric line converter as claimed in any one of claims 1, 2, 4 or 5, further comprising a circuit board disposed so as to divide said dielectric stripline into upper and lower stripline portions, and a microstripline disposed on said circuit board and electromagnetically coupled to said dielectric stripline.

10. A dielectric line converter as claimed in claim 9, wherein a length direction of said microstripline is disposed substantially at right angles to a length direction of said dielectric stripline.

11. A dielectric line converter as claimed in claim 9, wherein said first spacing between said upper and lower conductor surfaces in said first region is less than a height of said dielectric stripline so that in said first-kind dielectric line a cutoff frequency of an LSM01 mode is lower than a cutoff frequency of an LSE01 mode and as a result the first-kind dielectric line propagates substantially only the LSM01 mode.

12. A directional coupler comprising:

a first DWG line and a second DWG line; a coupling portion which electromagnetically couples respective central portions of said first and second DWG lines;

a dielectric line converter as claimed in claim 1;

at least one end of one of said first and second DWG lines being electromagnetically coupled to said second dielectric line of said dielectric line converter.

13. A high-frequency circuit comprising:

an antenna terminal; a transmission terminal; and a reception terminal; and a directional coupler as claimed in claim 12;

said directional coupler interconnecting at least two of said antenna terminal, transmission terminal, and reception terminal.

14. A dielectric line converter as claimed in claim 13, further comprising a transmission circuit connected to said transmission terminal and a reception circuit connected to said reception terminal.

15. A dielectric line converter as claimed in claim 14, further comprising an antenna connected to said antenna terminal.

16. A high-frequency circuit comprising:

an antenna terminal; a transmission terminal; and a reception terminal; and a dielectric line converter as claimed in claim 9;

said dielectric line converter interconnecting at least two of said antenna terminal, transmission terminal, and reception terminal.

* * * * *